(12) United States Patent
Nakagomi

(10) Patent No.: US 10,879,858 B2
(45) Date of Patent: *Dec. 29, 2020

(54) OSCILLATOR CIRCUIT USING COMPARATOR

(71) Applicant: FUJI ELECTRIC CO., LTD., Kawasaki (JP)

(72) Inventor: Kenji Nakagomi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/582,610

(22) Filed: Sep. 25, 2019

(65) Prior Publication Data

US 2020/0021258 A1 Jan. 16, 2020

Related U.S. Application Data

(63) Continuation of application No. PCT/JP2018/032079, filed on Aug. 30, 2018.

(30) Foreign Application Priority Data

Oct. 16, 2017 (JP) .................. 2017-200329

(51) Int. Cl.
*H03F 3/45* (2006.01)
*H03B 5/12* (2006.01)
*H03F 3/42* (2006.01)

(52) U.S. Cl.
CPC ....... *H03F 3/45071* (2013.01); *H03B 5/1203* (2013.01); *H03F 3/423* (2013.01)

(58) Field of Classification Search
CPC .................................................. H03K 3/0231
(Continued)

(56) References Cited

U.S. PATENT DOCUMENTS 5,387,882 A * 2/1995 Schoofs ............... H03K 4/50 331/111
2006/0033551 A1* 2/2006 Dong ................ H03K 19/0016 327/427

(Continued)

FOREIGN PATENT DOCUMENTS

JP 4-94210 A 3/1992
JP 7-202667 A 8/1995
(Continued)

OTHER PUBLICATIONS

International Search Report dated Oct. 16, 2018 in corresponding International Patent Application No. PCT/JP2018/032079 (In English).

(Continued)

*Primary Examiner* — Joseph Chang

(57) ABSTRACT

An oscillator circuit uses a comparator, and the oscillator circuit controls charge-discharge of the Miller capacitance between the gate and the drain of a MOSFET serving as an amplifier of the gain unit and the gate capacitance of the MOSFET, and enables the comparator output to follow a relatively high-frequency control signal that is input externally. The oscillator circuit uses a comparator having a differential unit and a gain unit. The oscillator circuit includes a charge-discharge control unit that connects to the output of the differential unit and is configured to control charge-discharge of the Miller capacitance between the gate and the drain of a MOSFET (N2) serving as an amplifier of the gain unit and the gate capacitance of the MOSFET, and an output control unit configured to control the output of the gain unit.

11 Claims, 20 Drawing Sheets

(58) Field of Classification Search
USPC .......................................................... 331/111
See application file for complete search history.

(56) References Cited

U.S. PATENT DOCUMENTS

2008/0186101 A1    8/2008  Arakali et al.
2020/0106427 A1*   4/2020  Nakagomi ............. H03K 3/353

FOREIGN PATENT DOCUMENTS

JP          2001-267893 A      9/2001
JP           2018-42028 A      3/2018

OTHER PUBLICATIONS

Written Opinion of the International Searching Authority dated Oct. 16, 2018 in corresponding International Patent Application No. PCT/JP2018/032079.

* cited by examiner

OSCILLATOR CIRCUIT USING COMPARATOR

CROSS-REFERENCE TO RELATED APPLICATIONS

This application is a continuation of International Application No. PCT/JP2018/032079, filed on Aug. 30, 2018, which claims priority to Japanese Patent Application No. 2017-200329, filed on Oct. 16, 2017. The disclosures of the aforementioned applications are hereby incorporated by reference in their entireties.

TECHNICAL FIELD

The present invention relates to an oscillator circuit using a comparator.

BACKGROUND ART

Semiconductor integrated circuits include an oscillator circuit configured to output a clock signal with a constant frequency for in-circuit time setting. One example of such an oscillator circuit includes an oscillator circuit using a comparator.

Comparators are one of the elements, and Patent Document 1 describes a comparator as one example.

Some oscillator circuits using a comparator include external resistor and capacitor connecting to one of the input terminals of the comparator, and change a reference voltage input to the other input terminal of the comparator depending on the output of the comparator. Such an oscillator circuit has an oscillatory frequency that is determined by the resistance value and the capacitance value of the external resistor and capacitor, and by the reference voltage.

FIG. 17 illustrates a conventional oscillator circuit using a comparator. An oscillator circuit 1 includes: a power-supply terminal VDD to receive an external power-supply voltage; an input terminal CG connecting to external resistor R0 and capacitor C0 to determine the oscillatory frequency; and a ground terminal GND connecting to the ground level. In this drawing, VDD indicates the power-supply voltage as well. The input terminal CG functions as the input terminal to receive an external control signal to control the oscillator circuit as well.

The oscillator circuit 1 also includes a comparator having a differential unit 2 and a gain unit 3 each connecting to the power-supply terminal VDD and the ground terminal GND, and a transistor (P-type MOSFET) P5 connecting to the power-supply terminal VDD and the ground terminal GND. The drain of the transistor P5 connects to a constant current source to flow a constant current "ibias".

The differential unit 2 includes transistors (P-type MOSFETs) P2 to P4 and transistors (N-type MOSFETs) N3 and N4. The drain of the transistor P5 connects to the gate of this transistor and to the gate of the transistor P2. The sources of the transistors P5 and P2 connect to the power-supply terminal VDD. The transistors P5 and P2 make up a current mirror circuit, and the transistor P2 serves as a constant current source that supplies a bias current to the differential unit 2, where the constant current "ibias" flowing through the transistor P5 is the reference current of the bias current (i.e., the bias current is proportional to the constant current "ibias").

The drain of the transistor P2 connects to the sources of the transistors P3 and P4 that make up a differential pair. The gates of the transistors P3 and P4 are the input of the differential unit 2. The gate of the transistor P3 receives the electric potential at the connecting point of the resistor R0 and the capacitor C0, or a control signal via the input terminal CG. The gate of the transistor P4 receives a reference voltage to be compared with the electric potential at the connecting point of the resistor R0 and the capacitor C0 or with the control signal input from an external circuit. The drain of the transistor P3 connects to the drain of the transistor N3. The drain of the transistor P4 connects to the drain and the gate of the transistor N4 and to the gate of the transistor N3. The sources of the transistors N3 and N4 connect to the ground terminal GND. The transistors N3 and N4 make up a current mirror circuit, and serve as an active load of the differential unit 2. The drain of the transistor P3 and the drain of the transistor N3 are the output of the differential unit 2.

The gain unit 3 includes a transistor (P-type MOSFET) P1 and a transistor (N-type MOSFET) N2 as an amplifier. A constant current flows through the transistor P1, and the constant current "ibias" is the reference current of this constant current (i.e., this constant current is proportional to the constant current "ibias"). The source of the transistor P1 connects to the power-supply terminal VDD, and the gate of this transistor connects to the drain of the transistor P5 and to the gate of the transistor P5. The transistors P5 and P1 make up a current mirror circuit. The drain and the source of the transistor N2 connect to the drain of the transistor P1 and the ground terminal GND, respectively. The gate of the transistor N2 receives the output of the differential unit 2. The connecting point of the drain of the transistor P1 and the drain of the transistor N2 is the output of the gain unit 3.

The oscillator circuit 1 also includes: a voltage-dividing circuit having resistors R2 to R6 that are serially connected in sequence between the power-supply terminal VDD and the ground terminal GND, and switches (N-type MOSFETs) N5 and N6. This voltage-dividing circuit yields a first reference voltage V1 that is a voltage at the connecting point between the resistor R3 and the resistor R4, and a second reference voltage V2 that is a voltage at the connecting point between the resistor R4 and the resistor R5. The second reference voltage V2 is lower than the first reference voltage. The first reference voltage V1 is input to the gate of the transistor P4 via the switch N5. The second reference voltage V2 is input to the gate of the transistor P4 via the switch N6 that operates in the opposite phase of the switch N5.

The comparator includes inverters INV1 and INV2 in addition to the differential unit 2 and the gain unit 3. The output of the gain unit 3 is input to the inverter INV2. The output of this inverter INV2 is input to the inverter INV1 and to the gate of the switch N5. The output of this inverter INV1 connects to the gate of the switch N6. The output of the inverter INV1 is the output of the comparator.

The oscillator circuit 1 also includes: a resistor R1 and a transistor (N-type MOSFET) N1 serially connected between the input terminal CG and the ground terminal GND. The gate of the transistor N1 receives the output of the comparator. A D-type flip-flop circuit D-FF frequency-divides the comparator output so that the resultant frequency is ½, and the output after such frequency-dividing is the clock output (the output of the oscillator circuit 1).

For typical operation of such an oscillator circuit 1, the oscillator circuit includes a resistor R0 externally connecting to the input terminal CG and the power-supply terminal VDD. The oscillator circuit also includes a capacitor C0 externally connecting to the input terminal CG and the ground terminal GND. In this case, charge-discharge of the capacitor C0 yields a control signal to be input to the input terminal CG.

In one example, let the power-supply voltage be 5 V, and the reference potential of the oscillator circuit 1 be at the ground level, i.e., 0 V. The resistors R2 to R6 have the same resistance values. This means that the first reference voltage V1 is 3 V. and the second reference voltage V2 is 2 V. All logical threshold voltages for the inverter INV1, the inverter INV2, and the D-type flip-flop circuit D-FF are ½×VDD. The resistance value of the resistor R1 is sufficiently smaller than the resistance value of the resistor R0. The resistance value of the resistor R0 and the capacitance value of the capacitor C0 are set so that the oscillatory frequency of the comparator output is about 200 kHz, i.e., the frequency of the clock output is about 100 kHz. The gate threshold voltage of the transistor N2 is set at 0.7 V.

FIG. 18 illustrates simulated waveforms of the voltage at various parts of the oscillator circuit 1 during typical operation. The horizontal axis in this drawing indicates time (μs). The vertical axis indicates CG voltage (V) that is the voltage at the input terminal CG in (a), output voltage of the differential unit (V) in (b), output voltage of the gain unit (V) in (c), comparator output voltage (V) in (d), and clock output voltage (V) in (e).

When the comparator output voltage is at a low level (0 V), the output of the inverter INV1 is at a low level and the output of the inverter INV2 is at a high level. This turns the switch N5 on and the switch N6 off. The reference voltage input to the differential unit 2 therefore is the first reference voltage V1. i.e., 3 V. The transistor N1 also turns off. This charges the capacitor C0 with a charge current $I_c$ illustrated in FIG. 17, so that the CG voltage increases from 2 V to 3 V. At this time, the output voltage of the differential unit is at a high level. The transistor N2 in the gain unit 3 therefore turns on, and the output voltage of the gain unit is at a low level (0 V).

When the CG voltage exceeds the first reference voltage V1, i.e., 3 V, the current flowing through the transistor P4 exceeds the current flowing through the transistor P3, so that the gate voltage of the transistors N3 and N4 increases. The output voltage of the differential unit gradually decreases while discharging the Miller capacitance between the gate and the drain of the transistor N2 and the gate capacitance of this transistor via the current flowing through the transistor N3.

Note here that the capacitance (parasitic capacitance) between the gate and the drain of the transistor N2 acts while having the magnitude multiplied by the voltage amplification factor of the transistor (strictly multiplied by (the voltage amplification factor+1)). This phenomenon is called the Miller effect. The value obtained by multiplying the capacitance between the gate and the drain by the voltage amplification factor of the transistor is called the Miller capacitance between the gate and the drain.

When the output voltage of the differential unit falls below the gate threshold voltage of the transistor N2, then the transistor N2 turns off. The output voltage of the gain unit then gradually increases while charging the Miller capacitance between the gate and the drain of the transistor N2 via the constant current from the transistor P1.

When the output voltage of the gain unit reaches the logical threshold voltage of the inverter INV2, then the output voltage of the inverter INV2 changes to a low level. The output voltage of the inverter INV1, i.e., the comparator output voltage changes to a high level (5 V). This turns the switch N5 off and the switch N6 on. The reference voltage input to the differential unit 2 therefore is the second reference voltage V2, i.e., 2 V. Turning on the transistor N1 discharges the capacitor C0. That is, as illustrated in FIG. 17, a discharge current $I_d$ flows from the capacitor C0 to the ground terminal GND via the input terminal CG, the resistor R1, and the transistor N1. This lowers the CG voltage.

When the CG voltage falls below the second reference voltage V2, i.e., 2 V, the current flowing through the transistor P3 exceeds the current flowing through the transistor P4 and the current flowing through the transistor P4 decreases, so that the gate voltage of the transistors N3 and N4 decreases. The output voltage of the differential unit changes to a high level. The transistor N2 therefore turns on, and the output voltage of the gain unit changes to a low level (0 V). The output voltage of the inverter INV2 change to a high level, and the output voltage of the inverter INV1, i.e., the comparator output voltage changes to a low level (0 V). This turns the switch N5 on and the switch N6 off. The reference voltage input to the differential unit 2 therefore is the first reference voltage V1, i.e., 3 V. The transistor N1 also turns off. This charges the capacitor C0 with the charge current $I_c$, so that the CG voltage increases.

Such an operation is repeated, so that the comparator output has the rectangular waveforms having the frequency determined by the resistance value of the resistor R0, the capacitance value of the capacitor C0, the first reference voltage V1 and the second reference voltage V2 (FIG. 18(d)). The D-type flip-flop circuit D-FF frequency-divides the comparator output so that the resultant frequency is ½, and the output after such frequency-dividing is the clock output (FIG. 18(e)).

FIG. 19 illustrates the configuration to conduct an inspection before shipment of a semiconductor integrated circuit including a digital circuit operating with the clock output of the oscillator circuit 1. In FIG. 19, like reference numerals indicate like parts in FIG. 17, and their detailed descriptions are omitted. To conduct the inspection before shipment, a rectangular-wave generation circuit 9 is externally connected to the input terminal CG, instead of the resistor R0 and the capacitor C0. This rectangular-wave generation circuit 9 is to input a rectangular-wave control signal to the input terminal CG, the rectangular-wave control signal having a frequency higher than the oscillatory frequency determined by the resistance value of the resistor R0 and the capacitance value of the capacitor C0. Such inputting of a control signal with a relatively high frequency is to overclock the clock output of the oscillator circuit 1 and to shorten the time required for the inspection before shipment of the semiconductor integrated circuit.

FIG. 20 illustrates simulated waveforms of the voltage at various parts of the oscillator circuit 1 when the rectangular-wave control signal by the rectangular-wave generation circuit 9 is input to the input terminal CG. As illustrated in (a) in the drawing, the rectangular waves have the amplitude between 0 V and 5 V, and have the frequency of 2 MHz. That is, the period of the rectangular waves is 500 ns.

When the CG voltage rises from a low level (0 V) to a high level (5 V), then the output voltage of the differential unit gradually decreases while discharging the Miller capacitance between the gate and the drain of the transistor N2 and the gate capacitance of this transistor via the current flowing through the transistor N3. In FIG. 20(b), "K51" denotes this.

When the output voltage of the differential unit falls below the gate threshold voltage of the transistor N2, then the transistor N2 turns off. The output voltage of the gain unit then gradually increases while charging the Miller capacitance between the gate and the drain of the transistor N2 via the constant current from the transistor P1. In FIG. 20(c), "K52" denotes this.

In this way, rising of the CG voltage decreases the output voltage of the differential unit and increases the output voltage of the gain unit. The CG voltage, however, falls before the output voltage of the gain unit reaches the logical threshold voltage (2.5 V) of the inverter INV2. Falling of the CG voltage decreases the output voltage of the gain unit as well, so that the output voltage of the gain unit finally changes to a low level.

That is, the output voltage of the gain unit does not reach the logical threshold voltage (2.5 V) of the inverter INV2 through the entire period. The comparator output voltage therefore is fixed to a low level (0 V) through the entire period, and so the oscillation does not occur. The clock output voltage therefore is fixed to a high level (5 V) (in the case of FIG. 20(e)) or to a low level (0 V) through the entire period, and so the oscillation does not occur.

In this way, the comparator output voltage fails to follow the rectangular-wave control signal with 2 MHz from the rectangular-wave generation circuit 9, i.e., overclocking to 2 MHz fails.

REFERENCE DOCUMENT LIST

Patent Document

Patent Document 1: JP 2001-267893 A

SUMMARY OF THE INVENTION

Problem to be Solved by the Invention

The present inventor found that such a failure of the comparator output to follow a relatively high-frequency control signal that is input externally results from the time required to charge and discharge the Miller capacitance between the gate and the drain of a MOSFET as an amplifier in the gain unit of the comparator and the gate capacitance of such a MOSFET.

The present invention aims to provide an oscillator circuit using a comparator, the oscillator circuit controlling charge-discharge of the Miller capacitance between the gate and the drain of a MOSFET serving as an amplifier of the gain unit and the gate capacitance of the MOSFET, and enabling the comparator output to follow a relatively high-frequency control signal that is input externally.

Means for Solving the Problem

To achieve the aim, an oscillator circuit according to one aspect of the present invention uses a comparator having a differential unit and a gain unit. The oscillator circuit includes: a charge-discharge control unit that connects to the output of the differential unit and is configured to control charge-discharge of the Miller capacitance between the gate and the drain of a MOSFET serving as an amplifier of the gain unit and the gate capacitance of the MOSFET; and an output control unit configured to control the output of the gain unit.

According to another aspect, the output of the differential unit connects to the gate of the MOSFET, and the output control unit has a first transistor having a drain connecting to the output of the gain unit, a source connecting to a reference potential of the oscillator circuit, and a gate connecting to the output of the differential unit.

The charge-discharge control unit may include: a logic circuit configured to receive a control signal to control the oscillator circuit; and an inverter configured to receive an output of the logic circuit. The output control unit further includes: a second transistor having a drain connecting to the output of the gain unit, a source connecting to the drain of the first transistor, and a gate connecting to the output of the inverter; and a switch inserted between the output of the differential unit and the gate of the first transistor, and having a gate connecting to the output of the inverter.

The output control unit may further include a third transistor having a drain connecting to the gate of the first transistor, a source connecting to the reference potential of the oscillator circuit, and a gate connecting to the output of the logic circuit.

The charge-discharge control unit may further include a fourth transistor having a drain connecting to the gate of the MOSFET, a source connecting to the reference potential of the oscillator circuit, and a gate connecting to the output of the logic circuit.

According to another aspect, the charge-discharge control unit may include a first inverter configured to receive a control signal to control the oscillator circuit, and the output control unit may include: a logic circuit configured to receive the output of the first inverter and the output of the gain unit; and a first transistor having a drain connecting to the output of the gain unit, a source connecting to a reference potential of the oscillator circuit, and a gate connecting to the output of the logic circuit.

The logic circuit may include: a second inverter configured to receive the output of the gain unit; a negative AND circuit configured to receive the output of the second inverter and the output of the first inverter; and a third inverter configured to receive the output of the negative AND circuit, and the output of the third inverter may be the output of the logic circuit.

The second inverter may have a logical threshold voltage that is higher than a logical threshold voltage of the first inverter.

The charge-discharge control unit may further include a second transistor having a drain connecting to the gate of the MOSFET, a source connecting to the reference potential of the oscillator circuit, and a gate connecting to the output of a negative OR circuit, the negative OR circuit being configured to receive the output of the first inverter and the output of the differential unit.

The control signal may be a signal generated based on the output of the gain unit or a signal externally input to the oscillator circuit, and the control signal may be input to one of the inputs of the differential unit.

Effects of the Invention

The present invention provides an oscillator circuit using a comparator, the oscillator circuit controlling charge-discharge of the Miller capacitance between the gate and the drain of a MOSFET serving as an amplifier of the gain unit and the gate capacitance of the MOSFET, and so enabling the comparator output to follow a relatively high-frequency control signal that is input externally.

MODE FOR CARRYING OUT THE INVENTION

The following describes some embodiments of the present invention. The present invention is not limited to the following embodiments.

First Embodiment

Figure 1:
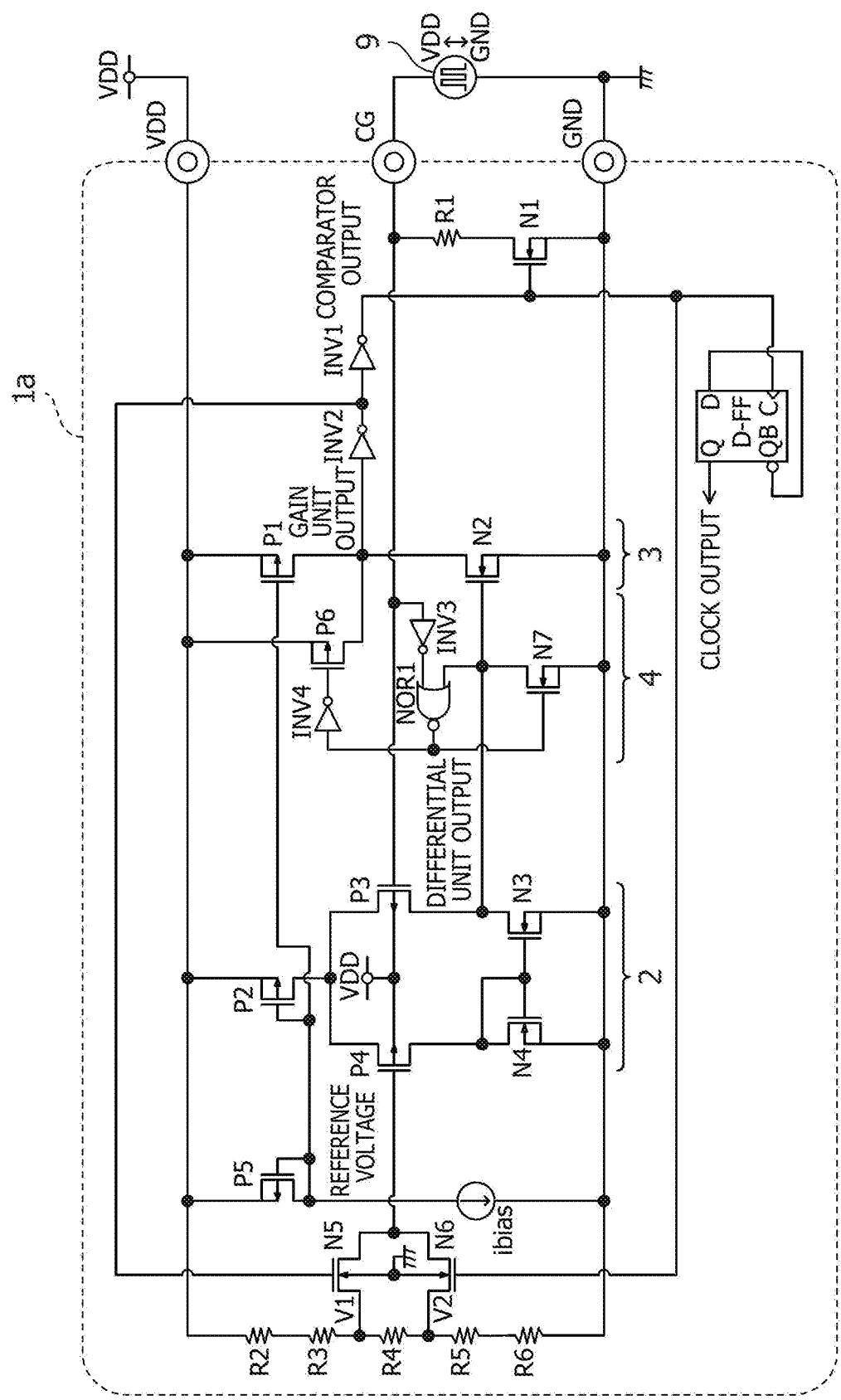
FIG. 1 describes an oscillator circuit (receiving 2 MHz control signal) according to one embodiment of the present invention.
Figure 19:
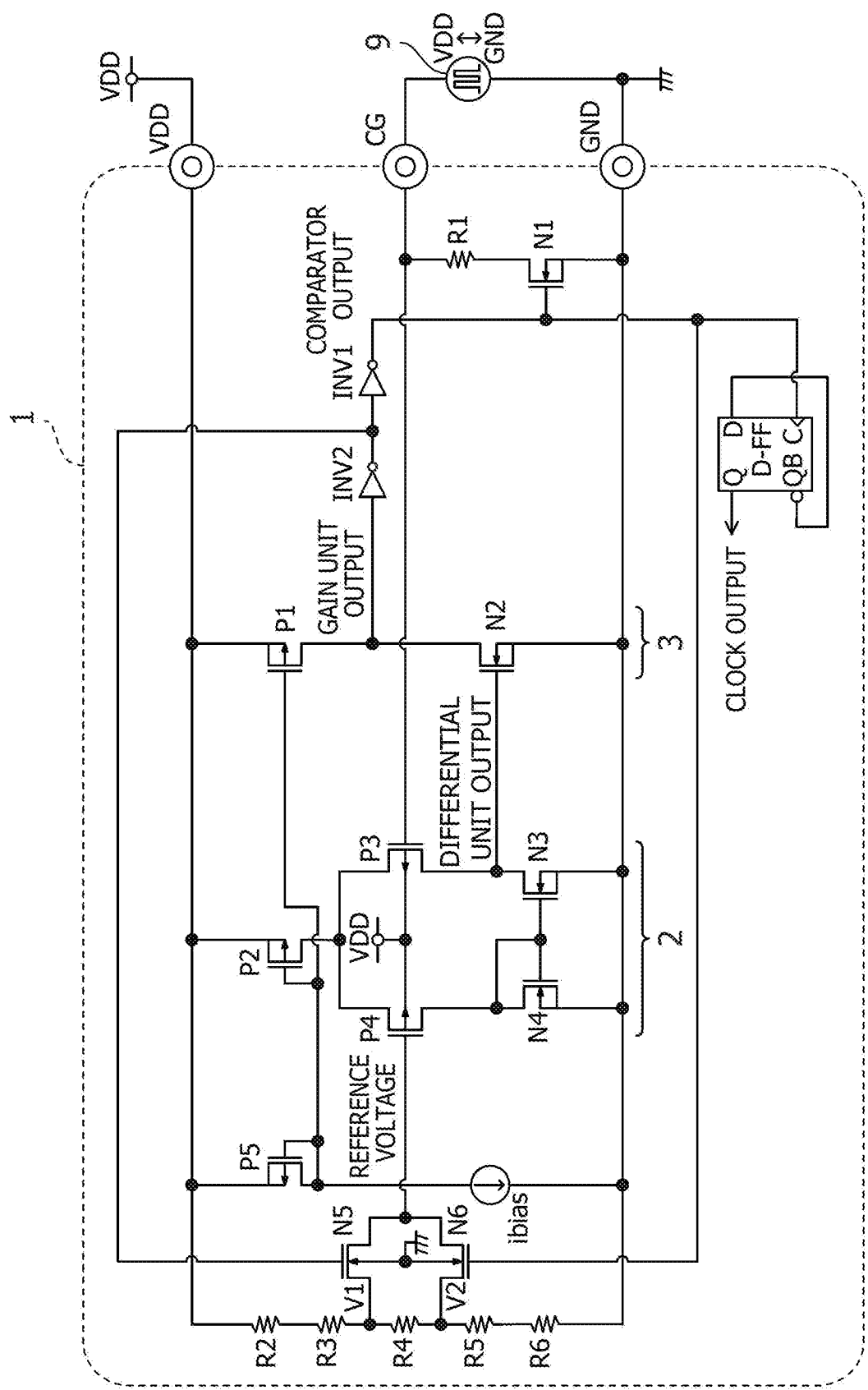
FIG. 19 describes a conventional oscillator circuit (receiving 2 MHz control signal).

FIG. 1 illustrates an oscillator circuit 1a and a rectangular-wave generation circuit 9 externally connected to the oscillator circuit, as a first embodiment of the present invention. In FIG. 1, like reference numerals indicate like parts in FIG. 19, and their detailed descriptions are omitted. The oscillator circuit 1a includes a charge-discharge control unit 4 in addition to the conventional configuration, and the charge-discharge control unit 4 is configured to control charge-discharge of the Miller capacitance between the gate and the drain of the transistor N2 and the gate capacitance of this transistor. The charge-discharge control unit 4 includes an inverter INV3, a negative OR circuit NOR1, a transistor (N-type MOSFET) N7, an inverter INV4, and a transistor (P-type MOSFET) P6.

The input of the inverter INV3 connects to the input terminal CG. That is, the inverter INV3 receives a rectangular-wave control signal from the rectangular-wave generation circuit 9. The output of this inverter INV3 is sent to one of the inputs of the negative OR circuit NOR1. The output of the negative OR circuit NOR1 connects to the gate of the transistor N7. The source of the transistor N7 connects to the ground terminal GND.

The output of the differential unit 2 (connecting point between the drain of the transistor P3 and the drain of the transistor N3) connects not only to the gate of the transistor N2 but also to the other input of the negative OR circuit NOR1 and the drain of the transistor N7. That is, the drain of the transistor N7 connects to the gate of the transistor N2.

The output of the negative OR circuit NOR1 connects to the input of the inverter INV4 as well. The output of the inverter INV4 connects to the gate of the transistor P6. The source of the transistor P6 connects to the power-supply terminal VDD, and the drain of the transistor P6 connects to the output of the gain unit (connecting point between the drain of the transistor P1 and the drain of the transistor N2).

In one example, let the power-supply voltage VDD be 5 V. and the reference potential of the oscillator circuit 1a be at the ground level, i.e., 0 V. The resistors R2 to R6 have the same resistance values. This means that the first reference voltage V1 input to the comparator is 3 V, and the second reference voltage V2 is 2 V. All logical threshold voltages for the inverters INV1 to INV4, the negative OR circuit NOR1, and the D-type flip-flop circuit D-FF are ½×VDD. The gate threshold voltage of the transistor N2 is 0.7 V.

Figure 2:
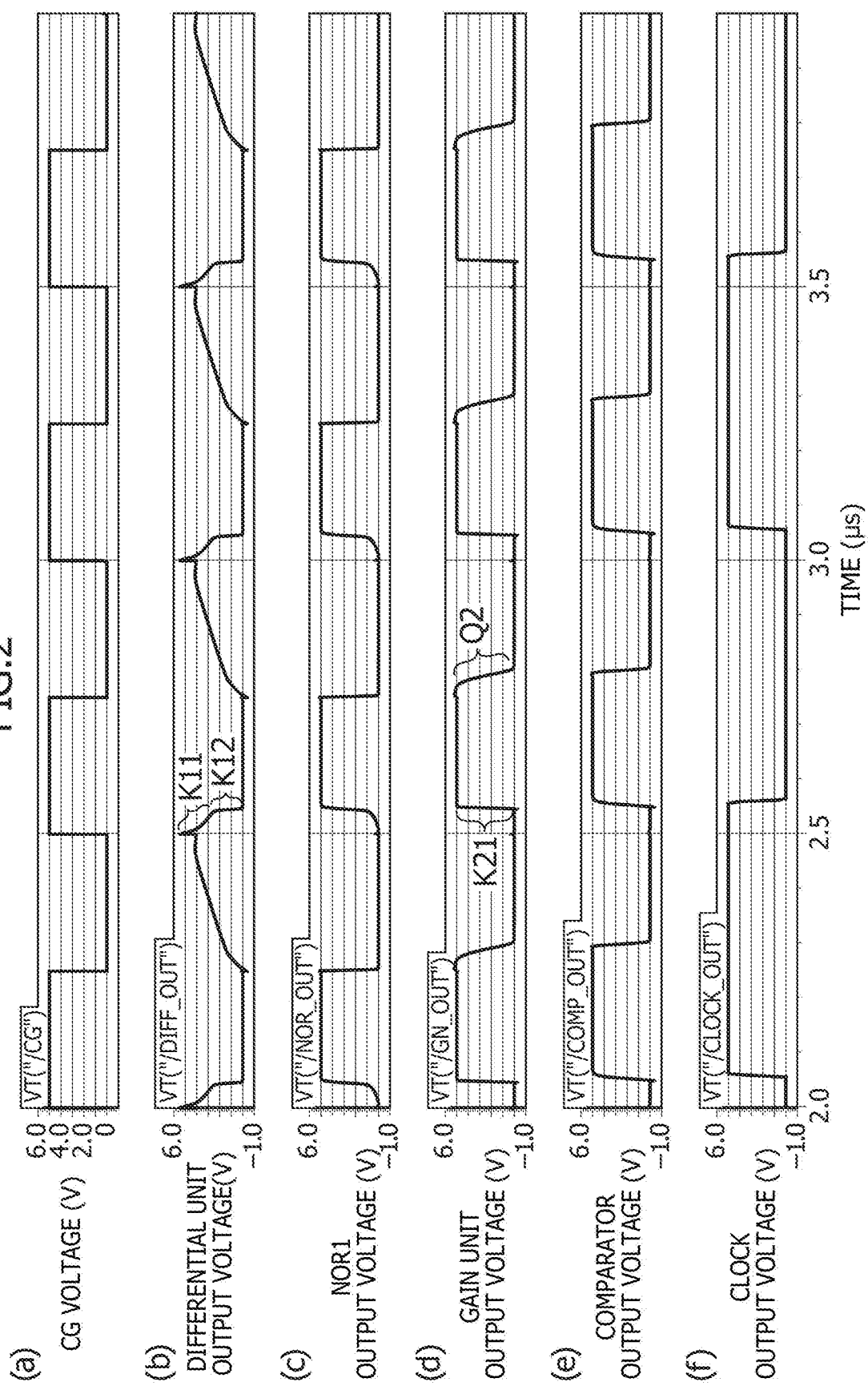
FIG. 2 is a timing chart illustrating the operation of the oscillator circuit (receiving 2 MHz control signal) according to one embodiment of the present invention.

FIG. 2 illustrates simulated waveforms of the voltage at various parts of the oscillator circuit 1a when the rectangular-wave control signal by the rectangular-wave generation circuit 9 is input to the input terminal CG. The horizontal axis in this drawing indicates time (μs). The vertical axis indicates CG voltage (V) that is the voltage at the input terminal CG in (a), output voltage of the differential unit (V) in (b), output voltage of the negative OR circuit NOR1 (V) in (c), output voltage of the gain unit (V) in (d), comparator output voltage (V) in (e), and clock output voltage (V) in (f).

As illustrated in (a) in the drawing, the rectangular-wave control signal has the amplitude between 0 V and 5 V, and has the frequency of 2 MHz. That is, the period of the rectangular-wave control signal is 500 ns.

When the CG voltage changes from a low level (0 V) to a high level (5 V), the output of the inverter INV3, which is one of the inputs of the negative OR circuit NOR1, changes to a low level. Subsequently, since the gate voltage of the transistor P3 is at a high level, the output voltage of the differential unit gradually decreases while discharging the Miller capacitance between the gate and the drain of the transistor N2 and the gate capacitance of this transistor. In FIG. 2(b), "K11" denotes this.

When the output voltage of the differential unit falls below the logical threshold voltage ½×VDD (2.5 V) of the negative OR circuit NOR1, both of the inputs of the negative OR circuit NOR1 change to a low level and the output of the negative OR circuit NOR1 changes to a high level (5 V).

This turns the transistor N7 on, so that the output of the differential unit generates a short with the ground terminal GND. This speeds up the discharging of the Miller capacitance and the gate capacitance as stated above, and the output voltage of the differential unit reaches 0 V almost concurrently with falling-below of 2.5 V. In FIG. 2(b). "K12" denotes this. As a result, the transistor N2 turns off.

Receiving the output of the negative OR circuit NOR1, the output of the inverter INV4 changes to a low level. As a result, the transistor P6 turns on. At this time, the current flowing through the transistor P6 is much greater than the constant current flowing through the transistor P1, so that the Miller capacitance is rapidly charged with the current flowing through the transistor P6. This changes the output voltage of the gain unit to a high level almost concurrently with the output of the negative OR circuit NOR1 changing to a high level. In FIG. 2(d), "K21" denotes this.

Figure 20:
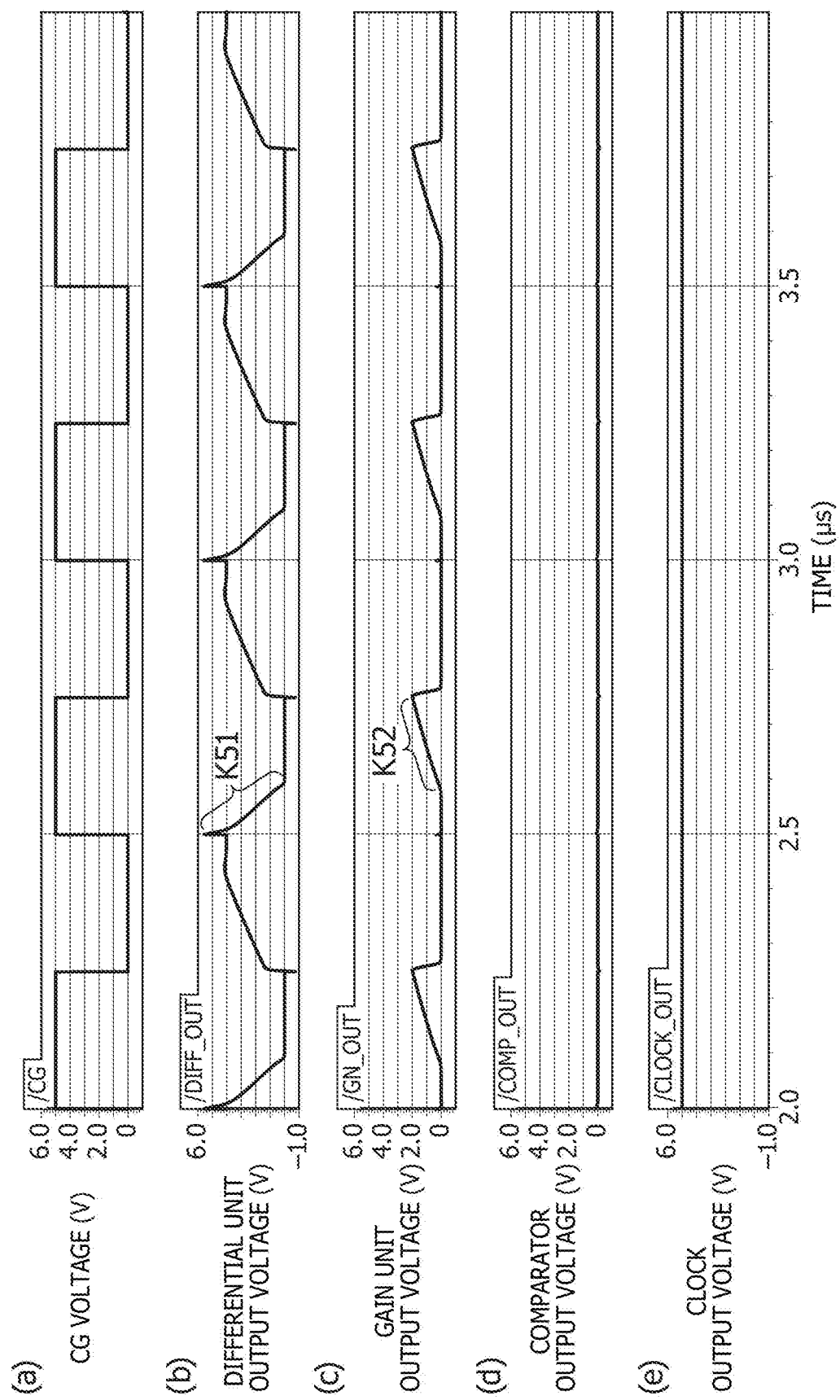
FIG. 20 is a timing chart illustrating the operation of the conventional oscillator circuit (receiving 2 MHz control signal).

As illustrated in FIG. 20, after 250 ns from the rising of the CG voltage in the conventional oscillator circuit 1, the output of the gain unit is still at a low level (less than 2.5 V). In contrast, as illustrated in FIG. 2, the output of the gain unit of the present embodiment changes to a high level before 100 ns from the rising of the CG voltage, and the comparator output voltage also changes to a high level.

In this way, the transistor N7 shortens the time required for discharging of the Miller capacitance between the gate and the drain of the transistor N2 and the gate capacitance of this transistor. The transistor P6 shortens the time required for charging of the Miller capacitance. This shortens the time required for the output voltage of the gain unit to reach the logical threshold voltage of the inverter INV2. The comparator output of the present embodiment therefore follows a relatively high-frequency control signal that is externally input.

The output of the differential unit is input to the gate of the transistor N2 and to the negative OR circuit NOR1, and the output of this negative OR circuit NOR1 is input to the gate of the transistor N7 that connects to the output of the differential unit and the ground terminal GND. Such a configuration functions with the logical threshold voltage of the negative OR circuit NOR1 that is higher than the gate threshold voltage of the transistor N2.

Specifically, the transistor N2 of the conventional oscillator circuit 1 turns off and the output voltage of the gain unit starts to increase only after the output voltage of the differential unit falls below the gate threshold voltage (e.g., 0.7 V) of the transistor N2. In contrast, the transistor N2 of the oscillator circuit 1a of the present embodiment turns off and the output voltage of the gain unit starts to increase when the output voltage of the differential unit decreases to the logical threshold voltage (e.g., 2.5 V) of the negative OR circuit NOR1 that is higher than the gate threshold voltage of the transistor N2. Additionally, charging with the transistor P6 starts at the timing of turning-off of the transistor N2. This shortens the time required for rising of the output of the gain unit.

Figure 3:
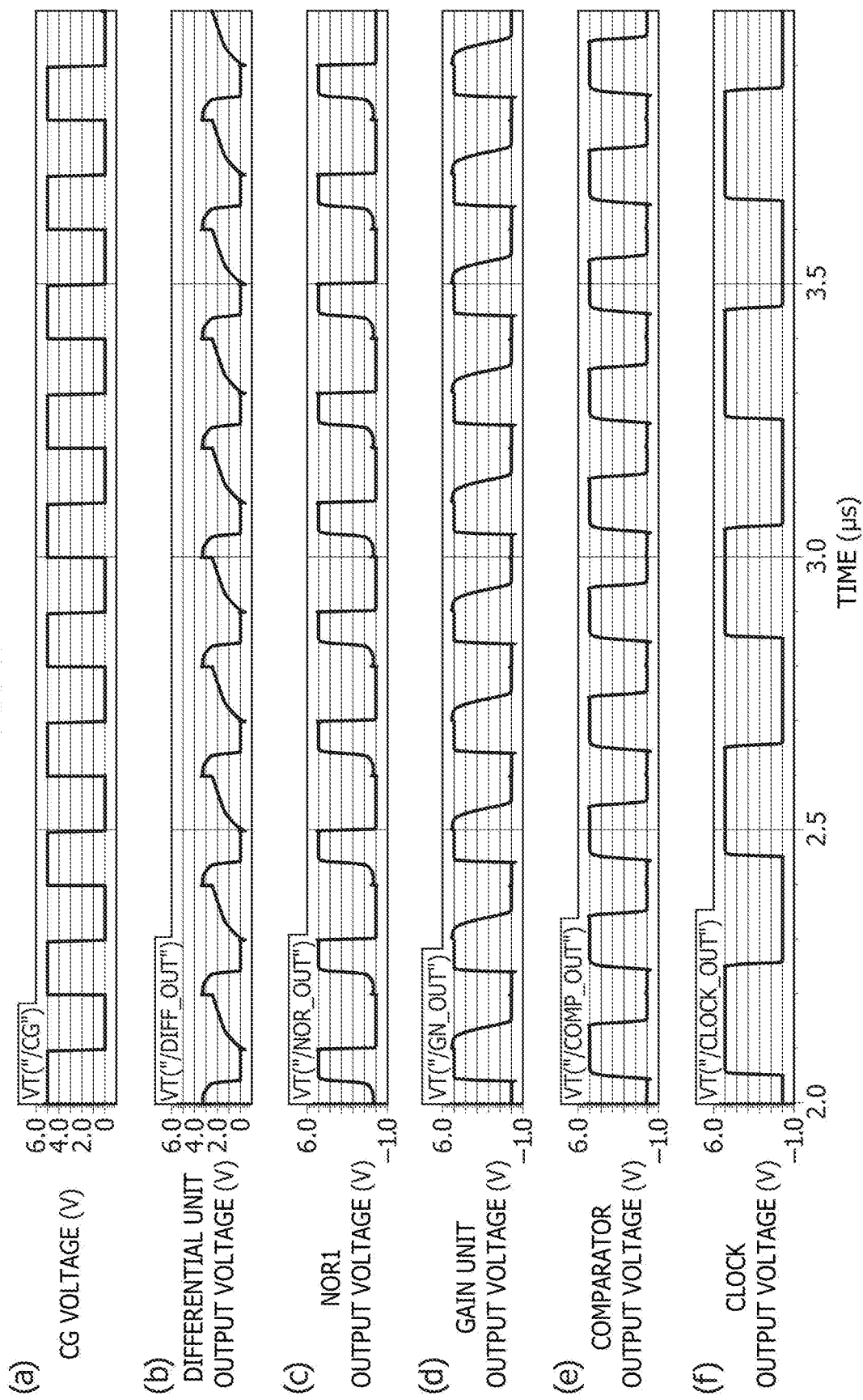
FIG. 3 is a timing chart illustrating the operation of the oscillator circuit (receiving 5 MHz control signal) according to one embodiment of the present invention.

FIG. 3 illustrates simulated waveforms of the voltage at various parts of the oscillator circuit 1a when the rectangular-wave control signal having the amplitude of 0 V to 5 V and the frequency of 5 MHz is input to the input terminal CG. This drawing illustrates that the comparator output voltage changes while following the voltage of the input terminal CG. In other words, the comparator output voltage is overclocked to about 5 MHz.

Figure 4:
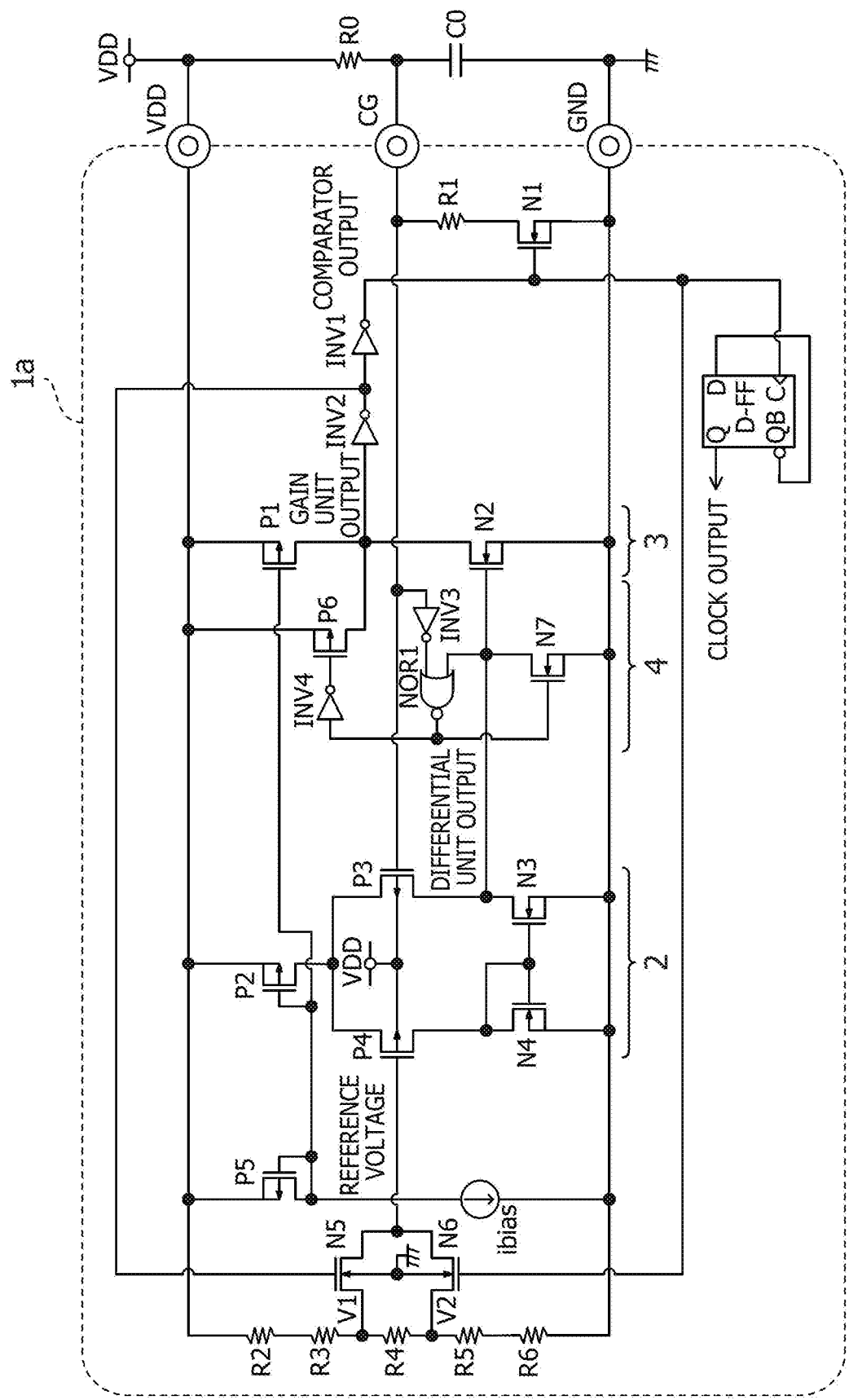
FIG. 4 describes an oscillator circuit (including externally connected CR) according to one embodiment of the present invention.
Figure 5:
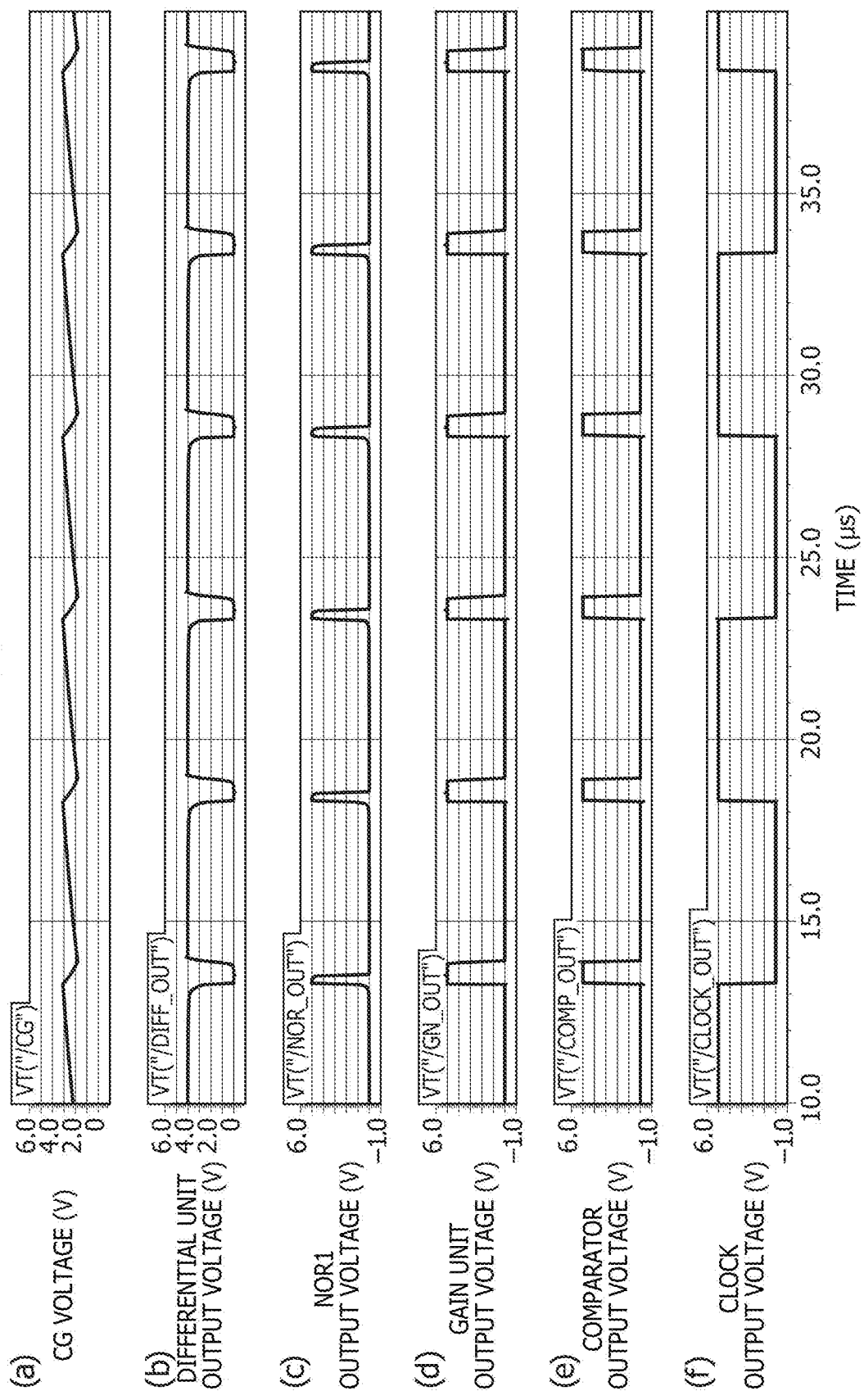
FIG. 5 is a timing chart illustrating the operation of the oscillator circuit (including externally connected CR) according to one embodiment of the present invention.
Figure 18:
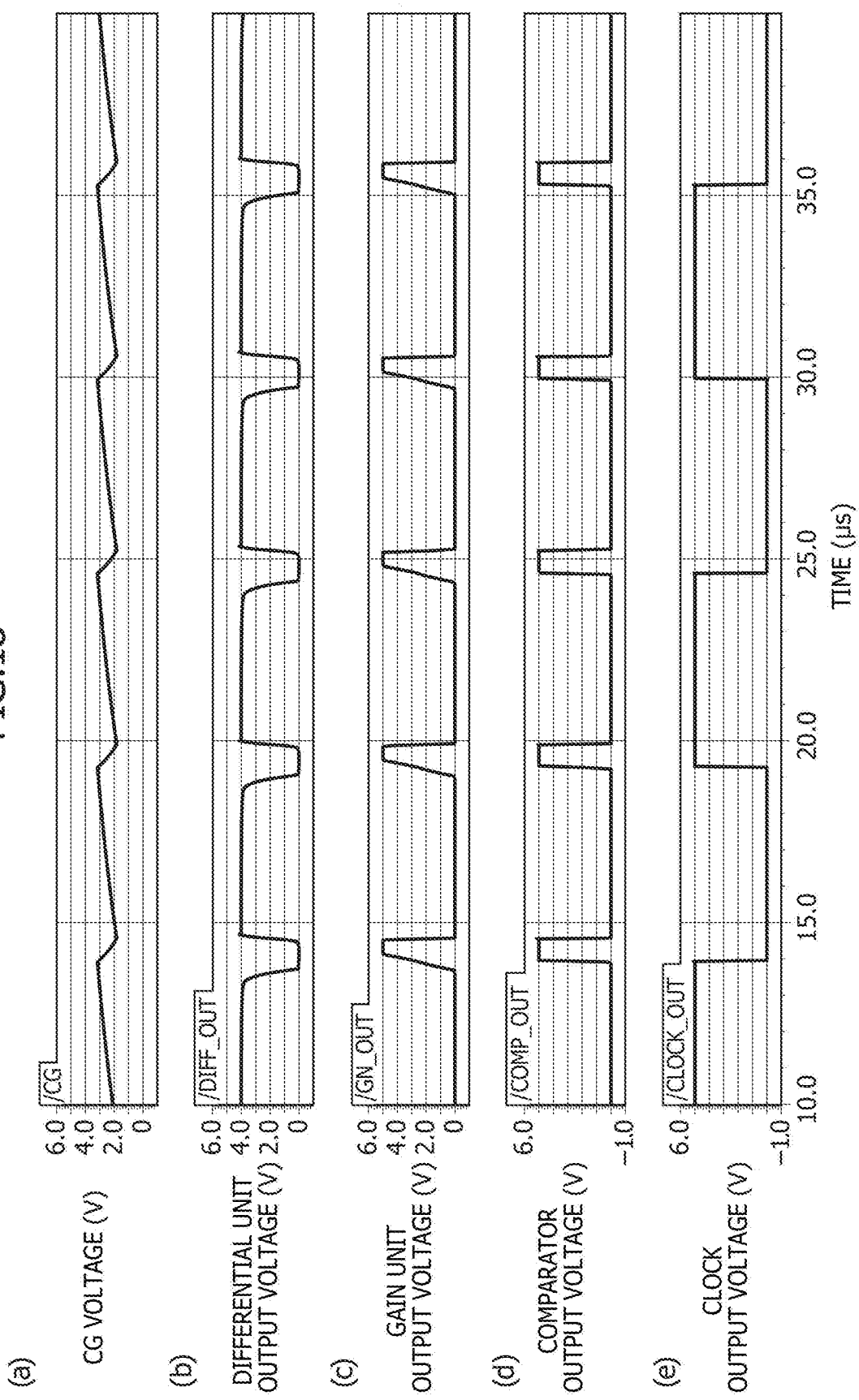
FIG. 18 is a timing chart illustrating the operation of the conventional oscillator circuit (including externally connected CR).

FIG. 4 illustrates the oscillator circuit 1a during typical operation. The oscillator circuit also includes a resistor R0 externally connected between the input terminal CG and the power-supply terminal VDD as well as a capacitor C0 externally connected between the input terminal CG and the ground terminal GND. FIG. 5 illustrates simulated waveforms of the voltage at various parts of the oscillator circuit 1a during typical operation. In a manner similar to that in FIG. 18, the drawing illustrates that the comparator output voltage has about 200 kHz and the D-type flip-flop circuit D-FF yields the clock output at about 100 kHz.

The inverters INV3 and INV4 may be called a first inverter and a second inverter, respectively, in the charge-discharge control unit. The transistors N7 and P6 may be called a discharge switch and a charge switch, respectively.

The configuration of the charge-discharge control unit 4 may be changed as needed. In one example, the inverter INV3 and the negative OR circuit NOR1 may be combined as one logic circuit. In this configuration, the input of the inverter INV3 can be the input of this logic circuit, and the output of the negative OR circuit NOR1 can be the output of this logic circuit.

Second Embodiment

Figure 6:
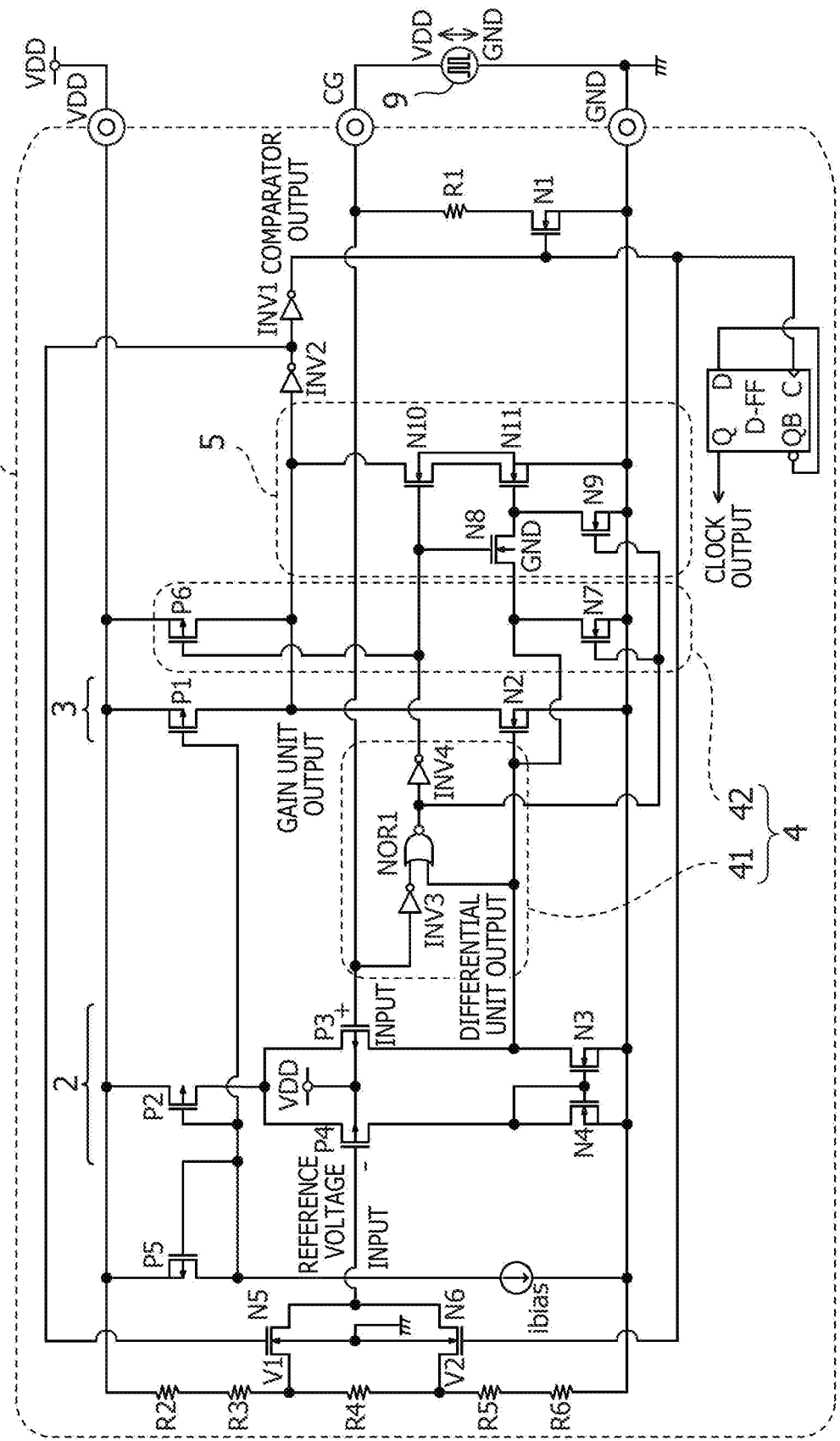
FIG. 6 describes an oscillator circuit (receiving 2 MHz control signal) according to a second embodiment of the present invention.

FIG. 6 illustrates an oscillator circuit 1b and a rectangular-wave generation circuit 9 externally connecting to the oscillator circuit, as a second embodiment of the present invention. In FIG. 6, like reference numerals indicate like parts in FIG. 1, and their detailed descriptions are omitted. Note here that the charge-discharge control unit 4 of FIG. 1 corresponds to the combination of a first detection logic unit 41 and a first auxiliary circuit 42 in FIG. 6. The first detection logic unit 41 includes an inverter INV3, a negative OR circuit NOR1 and an inverter INV4, and is configured to firstly detect the CG voltage reaching a high level. The first auxiliary circuit 42 includes transistors P6 and N7, and is configured to help the output of the gain unit change rapidly to a high level at the exact timing when the output of the gain unit is to change to a high level.

The oscillator circuit 1b includes a second auxiliary circuit 5 in addition to the configuration of the oscillator circuit 1a. The second auxiliary circuit 5 includes a switch (N-type MOSFET) N8 and transistors (N-type MOSFETs) N9 to N11, and is configured to help the output of the gain unit change to a low level speedily at the exact timing when the output of the gain unit is to change to a low level.

The drain of the transistor N10 connects to the output of the gain unit, and the source of the transistor N10 connects to the drain of the transistor N11. The source of the transistor N11 connects to the ground terminal GND. The output of the inverter INV4 is input to the gates of the switch N8 and of the transistor N10 in addition to the gate of the transistor P6.

The switch N8 is inserted between the output of the differential unit 2 and the gate of the transistor N11. The gate of the transistor N11 connects to the drain of the transistor N9. The output of the differential unit 2 is input not only to the gate of the transistor N2 but also to the drain of the transistor N9 and the gate of the transistor N11 via the switch N8. The source of the transistor N9 connects to the ground terminal GND, and the gate of the transistor N9 receives the output of the negative OR circuit NOR1.

Figure 7:
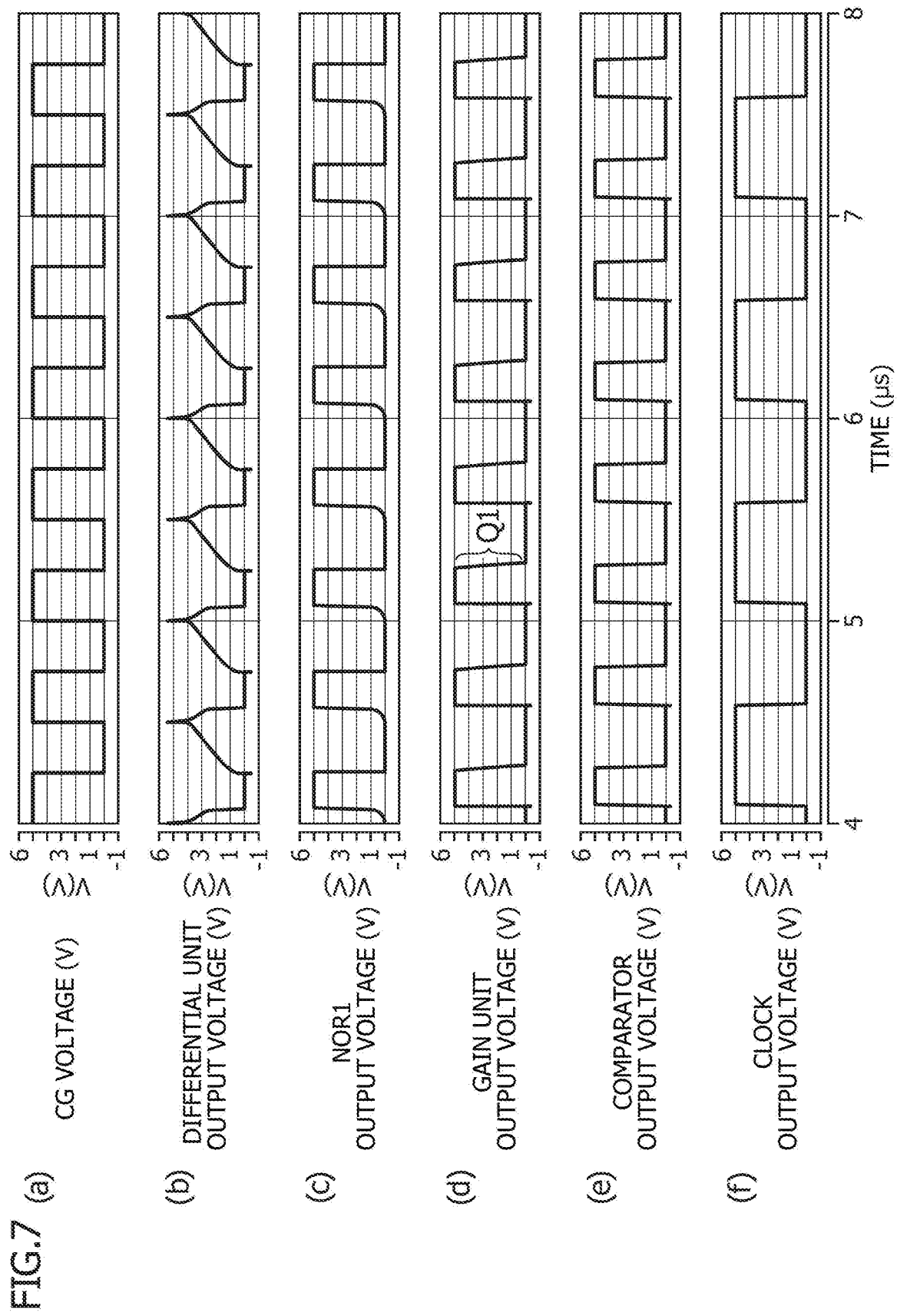
FIG. 7 is a timing chart illustrating the operation of the oscillator circuit (receiving 2 MHz control signal) according to the second embodiment of the present invention.

FIG. 7 illustrates simulated waveforms of the voltage at various parts of the oscillator circuit 1b when the rectangular-wave control signal by the rectangular-wave generation circuit 9 is input to the input terminal CG. The horizontal axis in this drawing indicates time (μs). The vertical axis indicates CG voltage (V) that is the voltage at the input terminal CG in (a), output voltage of the differential unit (V) in (b), output voltage at the negative OR circuit NOR1 (V) in (c), output voltage of the gain unit (V) in (d), comparator output voltage (V) in (e), and clock output voltage (V) in (f).

As illustrated in (a) in the drawing, the rectangular-wave control signal has an amplitude between 0 V and 5 V, and has a frequency of 2 MHz. That is, the period of the rectangular waves is 500 ns.

In the case other than "when the CG voltage as the input of the inverter INV3 is at a high level (>½×VDD) and the output of the differential unit 2 is at a low level (<½× VDD)". i.e., at the exact timing when the output of the gain unit 3 is to change to a low level (or is at a low level), the output of the negative OR circuit NOR1 changes to a low level and the output of the inverter INV4 changes to a high level. Then, the switch N8 and the transistor N10 turn on and the transistor N9 turns off.

This results in the transistor N11 connecting in parallel to the transistor N2. This means an increase of the current capacity, so that the output of the gain unit 3 rapidly decreases to a low level. In the drawing (d). "Q1" denotes this. As is clear from the comparison with "Q2" in FIG. 2(d), this shortens the time from the output of the negative OR circuit NOR1 changing to a low level to the output of the gain unit changing to a low level.

In the case "when the CG voltage as the input of the inverter INV3 is at a high level (>½×VDD) and the output of the differential unit 2 is at a low level (<½×VDD)", i.e., at the exact timing when the output of the gain unit 3 is to change to a high level (or is at a high level), the output of the negative OR circuit NOR1 changes to a high level and the output of the inverter INV4 changes to a low level. Then, the switch N8 and the transistor N10 turn off and the transistor N9 turns on. This disconnects the transistor N11 from the transistor N2 and the output of the gain unit.

Figure 8:
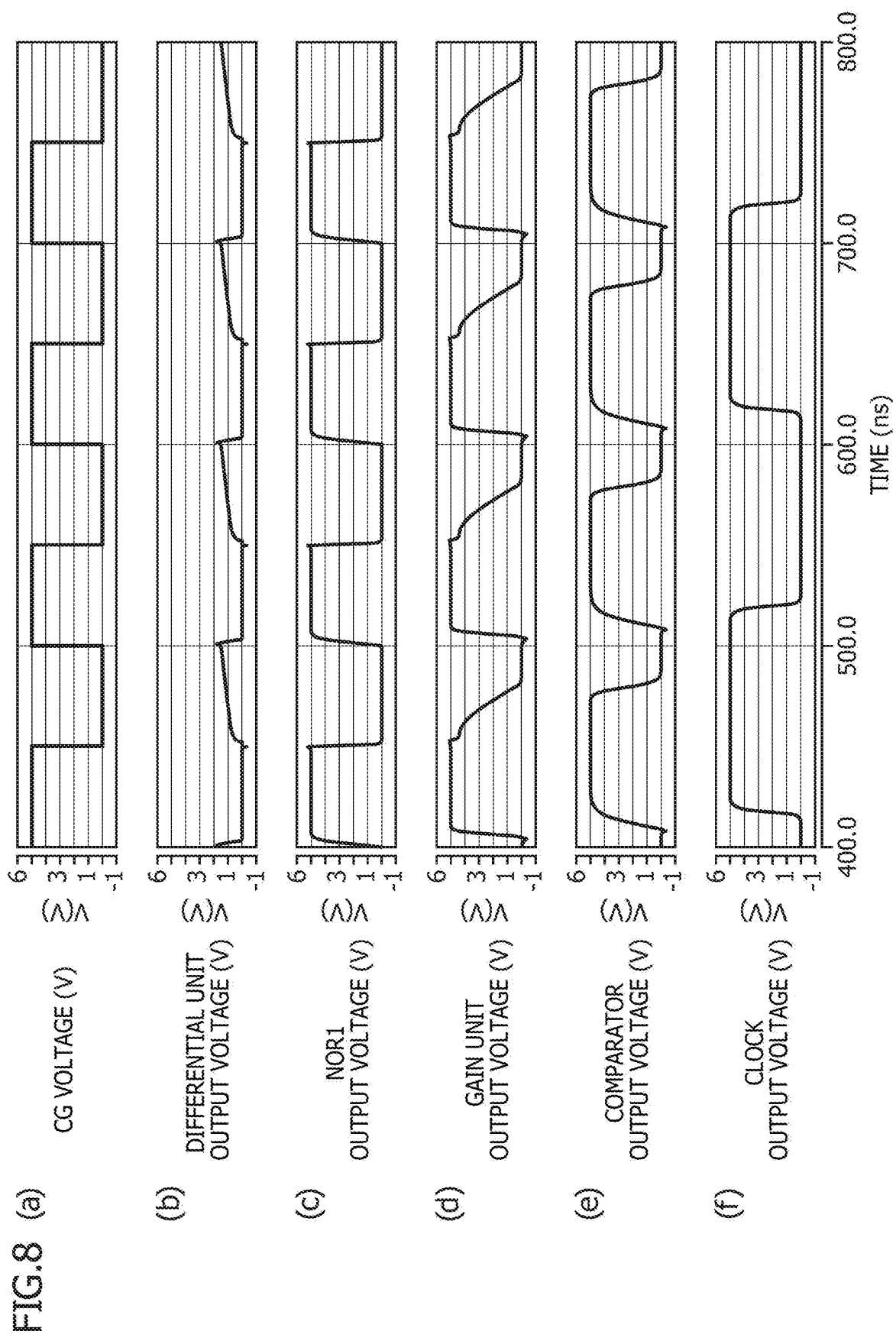
FIG. 8 is a timing chart illustrating the operation of the oscillator circuit (receiving 10 MHz control signal) according to the second embodiment of the present invention.
Figure 9:
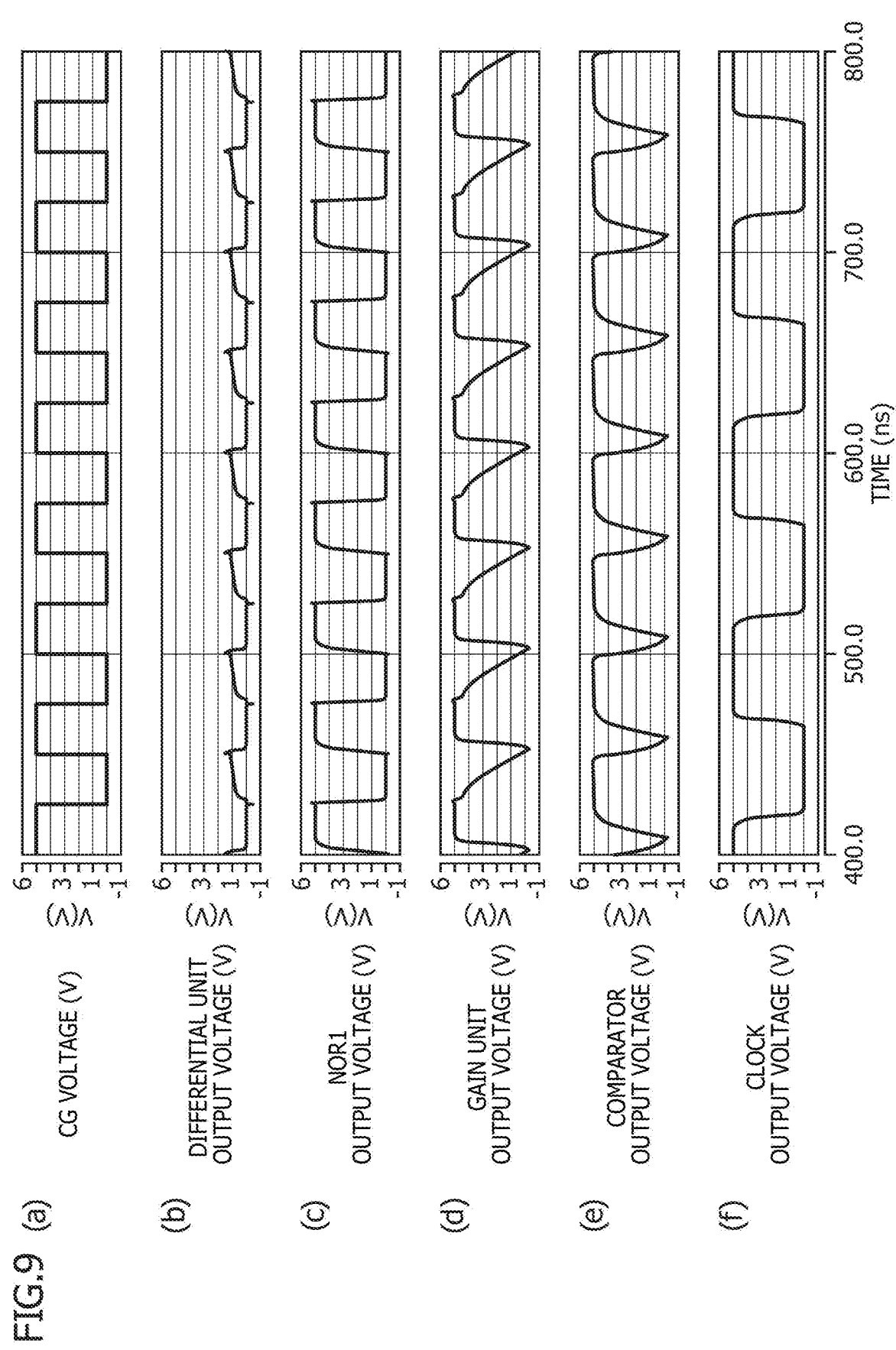
FIG. 9 is a timing chart illustrating the operation of the oscillator circuit (receiving 20 MHz control signal) according to the second embodiment of the present invention.

FIG. 8 illustrates simulated waveforms of the voltage at various parts of the oscillator circuit 1b when the rectangular-wave control signal having the amplitude of 0 V to 5 V and the frequency of 10 MHz is input to the input terminal CG. FIG. 9 illustrates simulated waveforms of the voltage at various parts of the oscillator circuit 1b when the rectangular-wave control signal having the amplitude of 0 V to 5 V and the frequency of 20 MHz is input to the input terminal CG. These drawings illustrate that the comparator output voltage changes while following the voltage of the input terminal CG. In other words, the comparator output voltage is overclocked to about 20 MHz.

Figure 10:
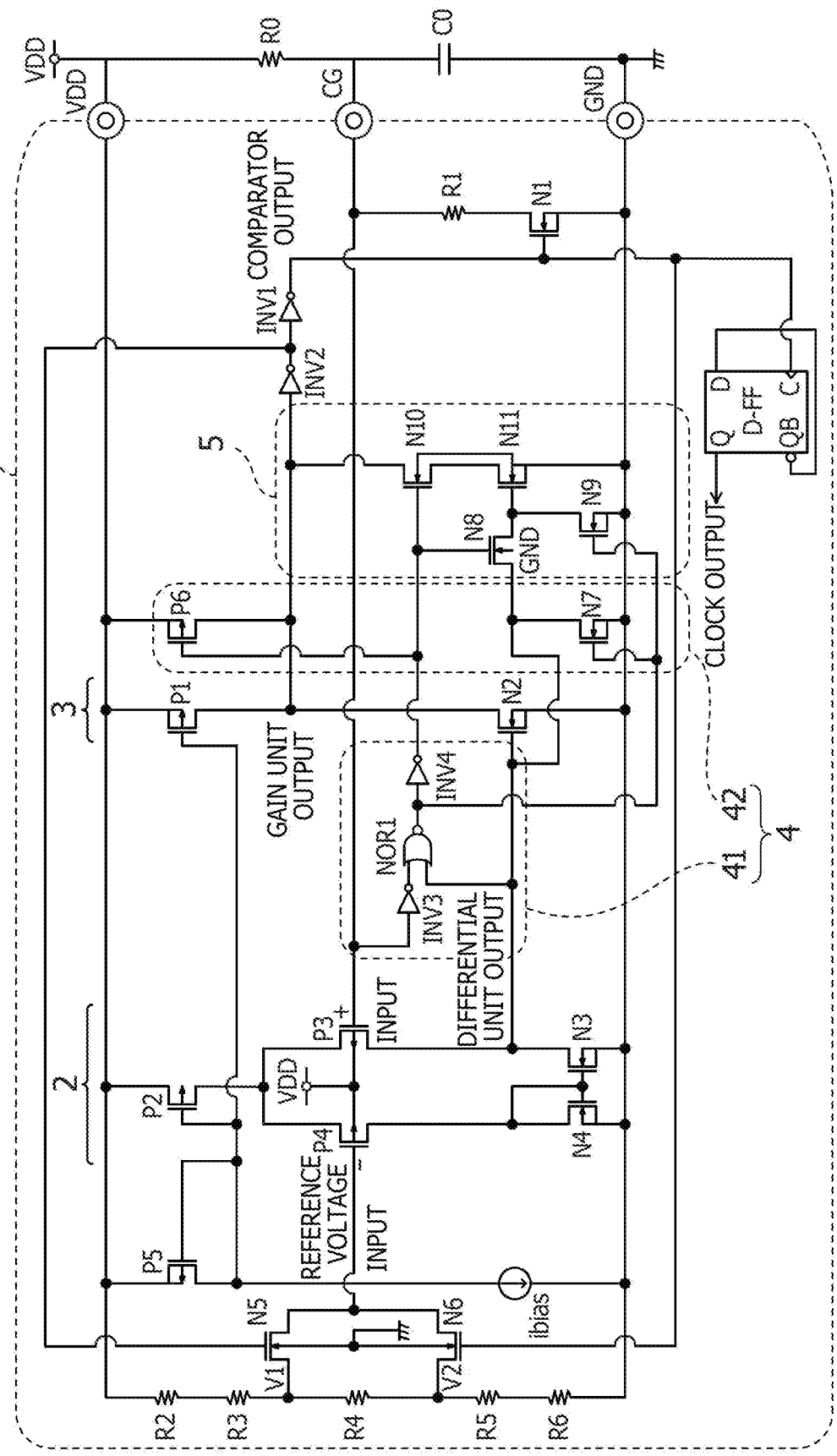
FIG. 10 describes an oscillator circuit (including externally connected CR) according to the second embodiment of the present invention.
Figure 11:
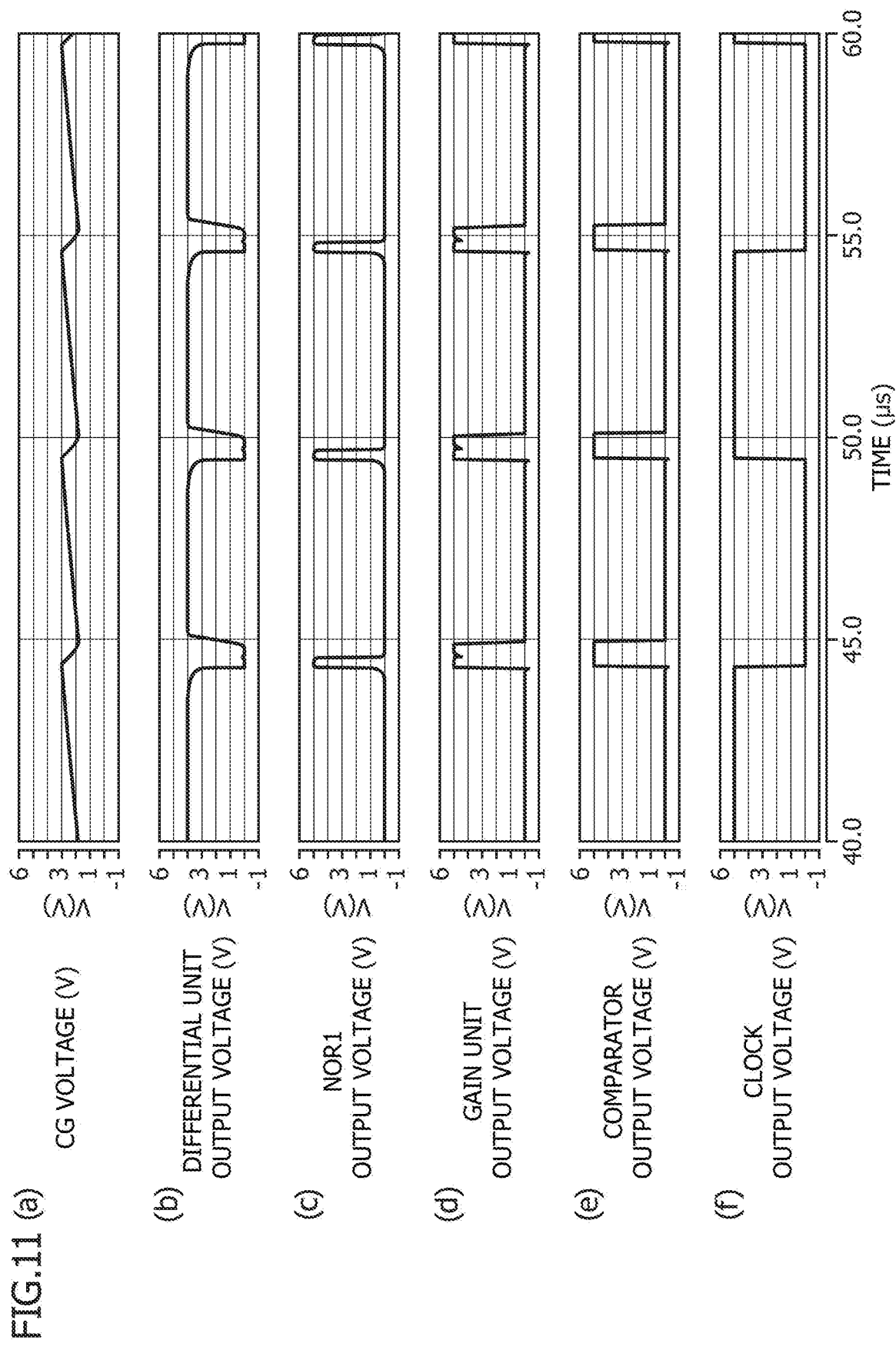
FIG. 11 is a timing chart illustrating the operation of the oscillator circuit (including externally connected CR) according to the second embodiment of the present invention.

FIG. 10 illustrates the oscillator circuit 1b during typical operation. The oscillator circuit also includes a resistor R0 externally connected between the input terminal CG and the power-supply terminal VDD as well as a capacitor C0 externally connected between the input terminal CG and the ground terminal GND. FIG. 11 illustrates simulated waveforms of the voltage at various parts of the oscillator circuit 1b during typical operation. In a manner similar to that in FIG. 18, the drawing illustrates that the comparator output voltage has about 200 kHz and the D-type flip-flop circuit D-FF yields the clock output at about 100 kHz.

The second auxiliary circuit 5 may be called an output control unit to control the output of the gain unit.

Third Embodiment

Figure 12:
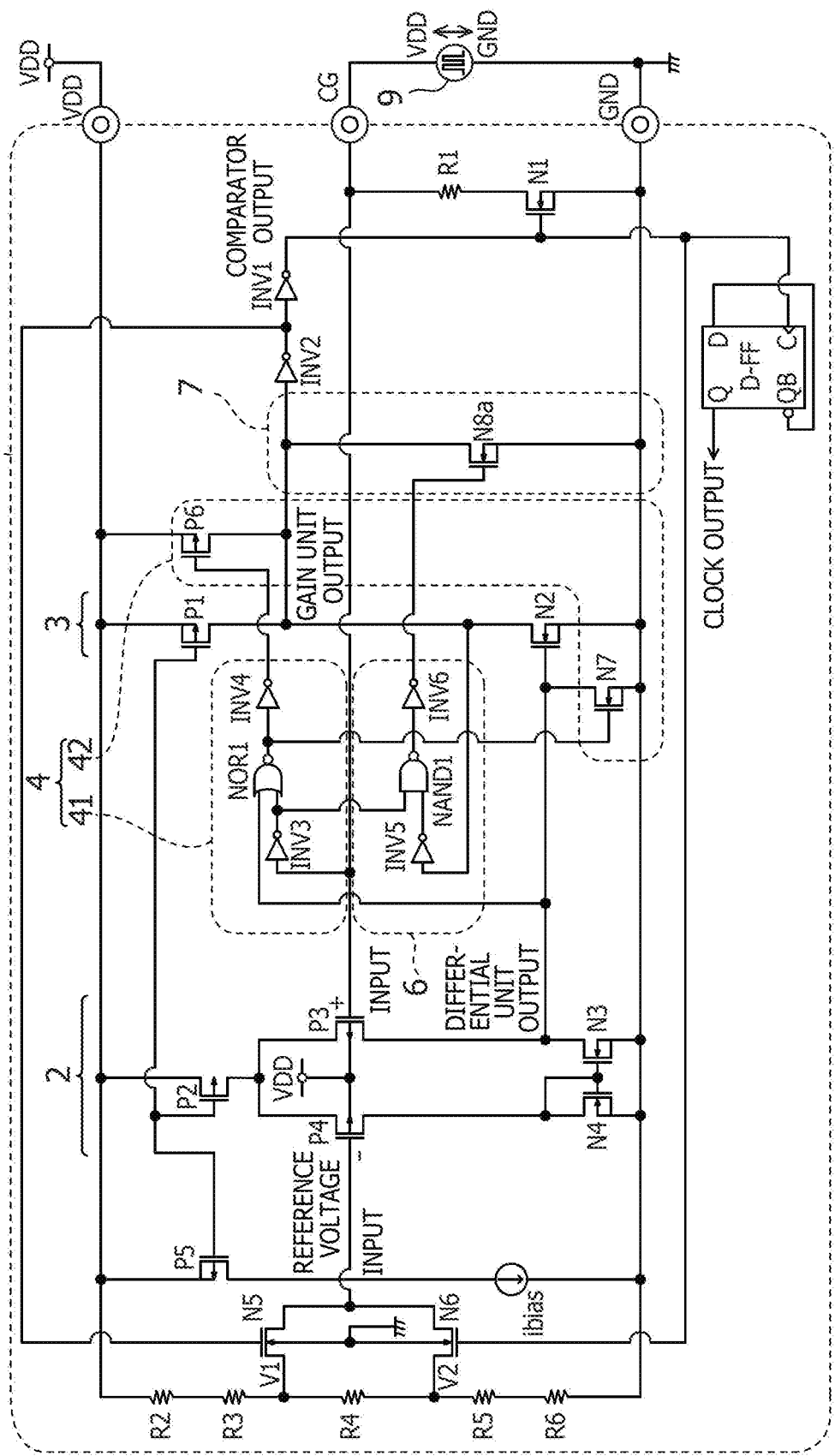
FIG. 12 describes an oscillator circuit (receiving 10 MHz control signal) according to a third embodiment of the present invention.

FIG. 12 illustrates an oscillator circuit 1c and a rectangular-wave generation circuit 9 externally connecting to the oscillator circuit, as a third embodiment of the present invention. In FIG. 12, like reference numerals indicate like parts in FIG. 6, and their detailed descriptions are omitted.

The oscillator circuit 1c includes a second detection logic unit 6 and a second auxiliary circuit 7 in addition to the configuration of the oscillator circuit 1a. The second detection logic unit 6 includes an inverter INV5, a negative AND circuit NAND1 and an inverter INV6, and is configured to first detect the CG voltage reaching a low level. The second auxiliary circuit 7 includes a transistor (N-type MOSFET) N8a having a drain connecting to the output of the gain unit and a source connecting to the ground terminal GND, and is configured to help the transistor N8a turn on at the exact timing when the output of the gain unit is to change to a low level and the output of the gain unit change to a low level speedily.

The output of the gain unit is input to the inverter INV5. The output of this inverter INV5 and the output of the inverter INV3 are input to the negative AND circuit NAND1. The output of the negative AND circuit NAND1 is input to the inverter INV6, and the output of this inverter INV6 is input to the gate of the transistor N8a.

In one example, let the power-supply voltage VDD be 5 V. and the reference potential of the oscillator circuit 1c be at the ground level, i.e., 0 V. The resistors R2 to R6 have the same resistance values. This means that the first reference voltage V1 input to the comparator is 3 V, and the second reference voltage V2 is 2 V. All logical threshold voltages for the inverters INV1 to INV4 and INV6 and the D-type flip-flop circuit D-FF are ½×VDD. The logical threshold voltage of the inverter INV5 is ⅔×VDD. This means that the logical threshold voltage of the inverter INV5 is higher than the logical threshold voltage of the inverter INV3.

Figure 13:
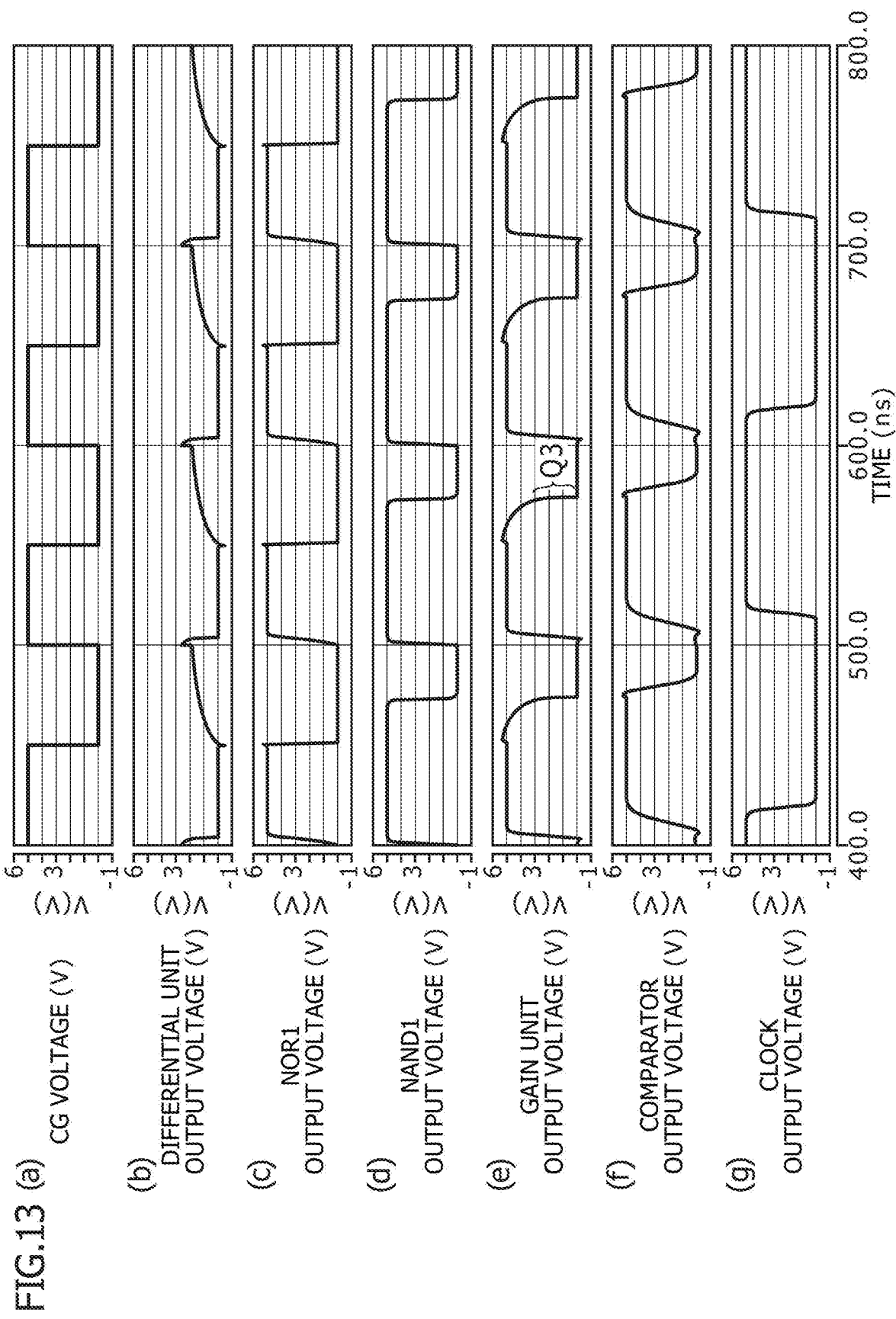
FIG. 13 is a timing chart illustrating the operation of the oscillator circuit (receiving 10 MHz control signal) according to the third embodiment of the present invention.

FIG. 13 illustrates simulated waveforms of the voltage at various parts of the oscillator circuit 1c when the rectangular-wave control signal by the rectangular-wave generation circuit 9 is input to the input terminal CG. The horizontal axis in this drawing indicates time (ns). The vertical axis indicates CG voltage (V) that is the voltage at the input terminal CG in (a), output voltage of the differential unit (V) in (b), output voltage of the negative OR circuit NOR1 (V) in (c), output voltage of the negative AND circuit NAND1 (V) in (d), output voltage of the gain unit (V) in (e), comparator output voltage (V) in (f), and clock output voltage (V) in (g).

As illustrated in (a) in the drawing, the rectangular-wave control signal has the amplitude between 0 V and 5 V, and has the frequency of 10 MHz. That is, the period of the rectangular waves is 100 ns.

When the second detection logic unit 6 detects that the CG voltage and the output of the gain unit are input and the CG voltage changes to a low level (0 V in FIG. 12) and the output of the gain unit changes to a low level (⅔×VDD or less), then the output of the negative AND circuit NAND1 changes to a low level (the output of the inverter INV6 is at a high level). Such output of the negative AND circuit NAND1 at a low level (the output of the inverter INV6 at a high level) turns the transistor N8a of the second auxiliary circuit on, so that the output of the gain unit rapidly changes to a low level ("Q3" in FIG. 13(e)). As illustrated in FIG. 13(e), the output voltage of the gain unit changes gently and decreases slowly at the initial stage of the falling. The logical threshold voltage of the inverter INV5 to detect the falling of the output voltage of the gain unit therefore is set higher than the logical threshold voltages of other inverters so as to enable rapid detection of the start of the falling of such output voltage of the gain unit.

Figure 14:
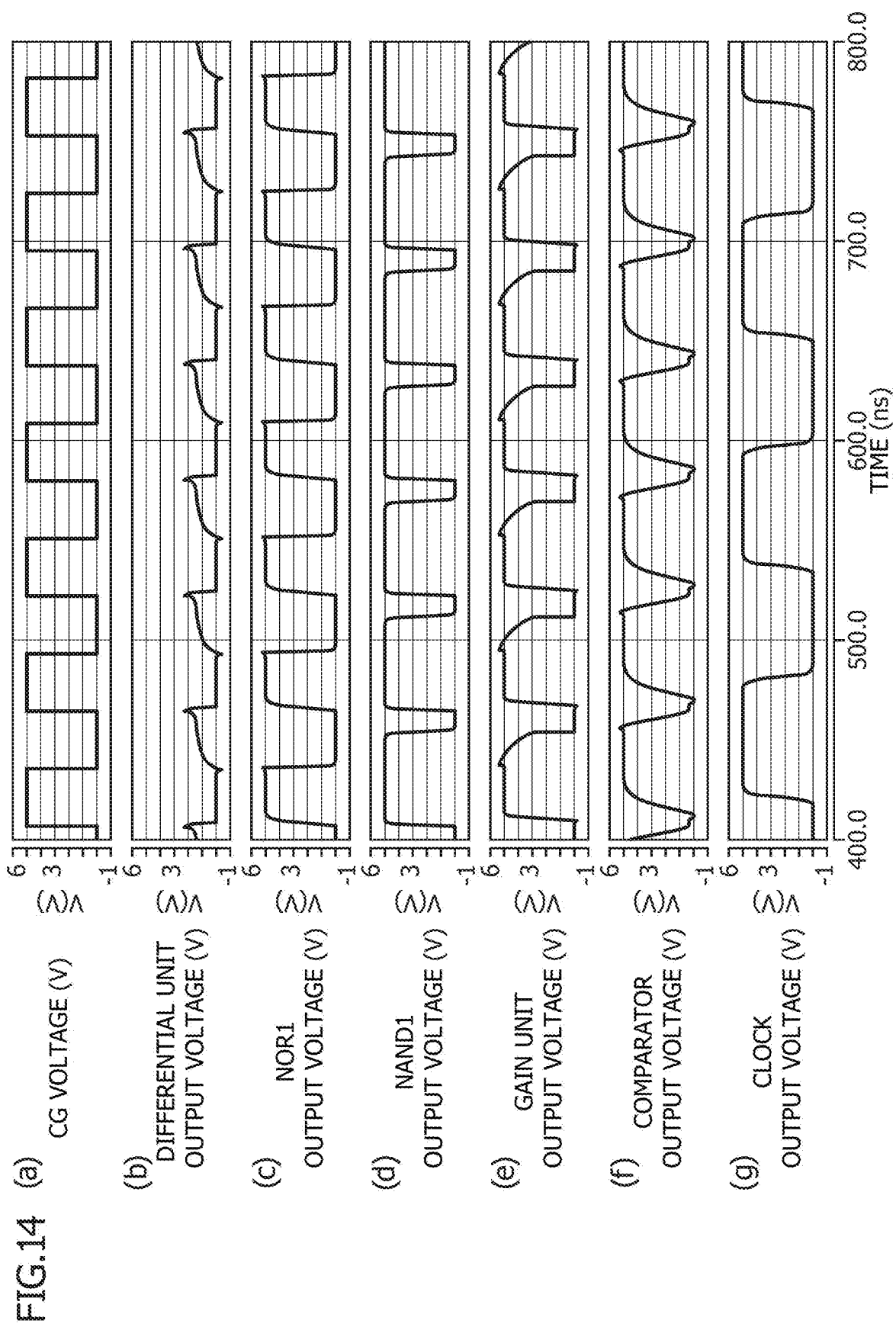
FIG. 14 is a timing chart illustrating the operation of the oscillator circuit (receiving 17 MHz control signal) according to the third embodiment of the present invention.

FIG. 14 illustrates simulated waveforms of the voltage at various parts of the oscillator circuit 1c when the rectangular-wave control signal having the amplitude of 0 V to 5 V and the frequency of 17 MHz is input to the input terminal CG. This drawing illustrates that the comparator output voltage changes while following the voltage of the input terminal CG. In other words, the comparator output voltage is overclocked to about 17 MHz.

Figure 15:
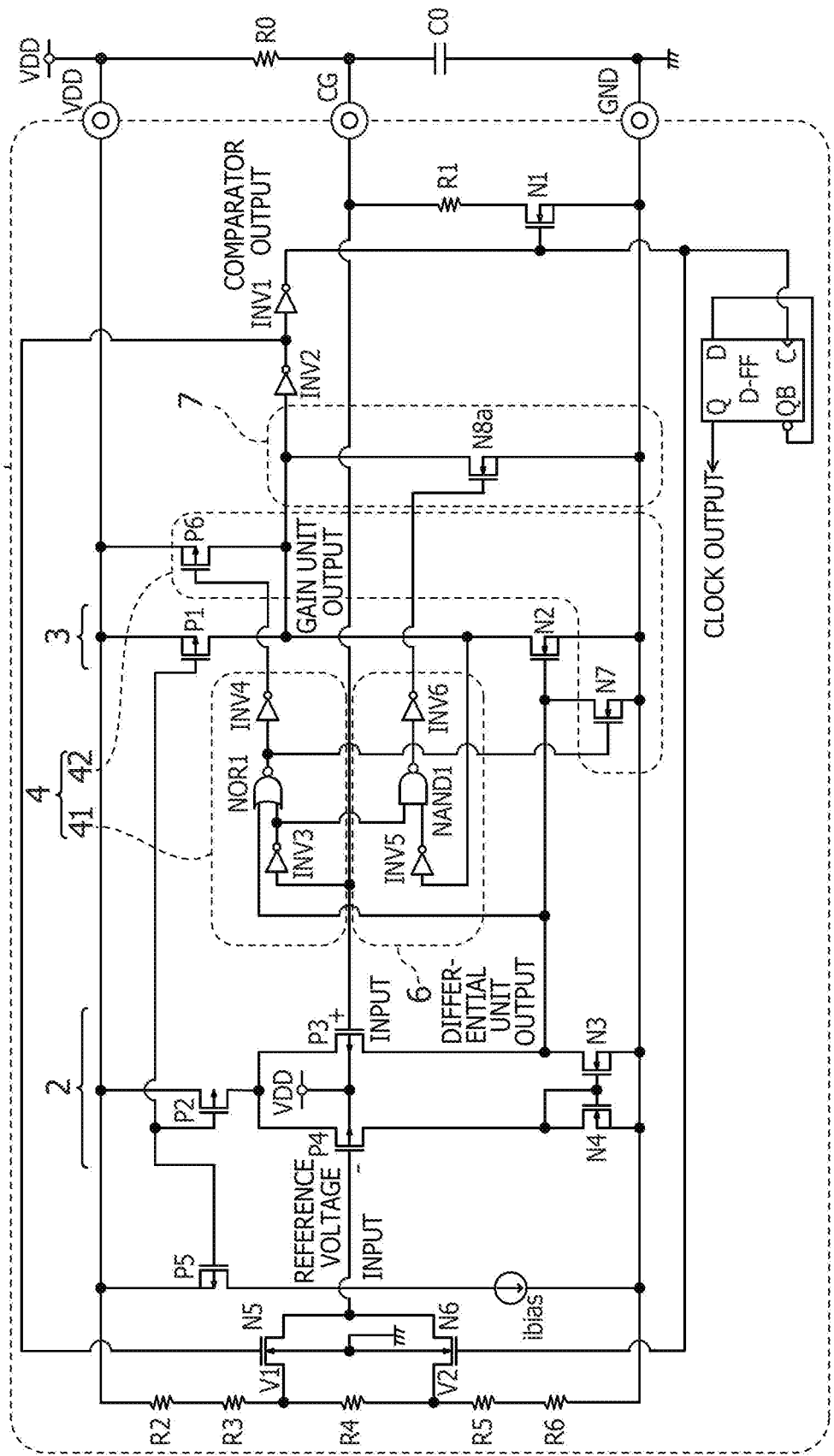
FIG. 15 describes an oscillator circuit (including externally connected CR) according to the third embodiment of the present invention.
Figure 16:
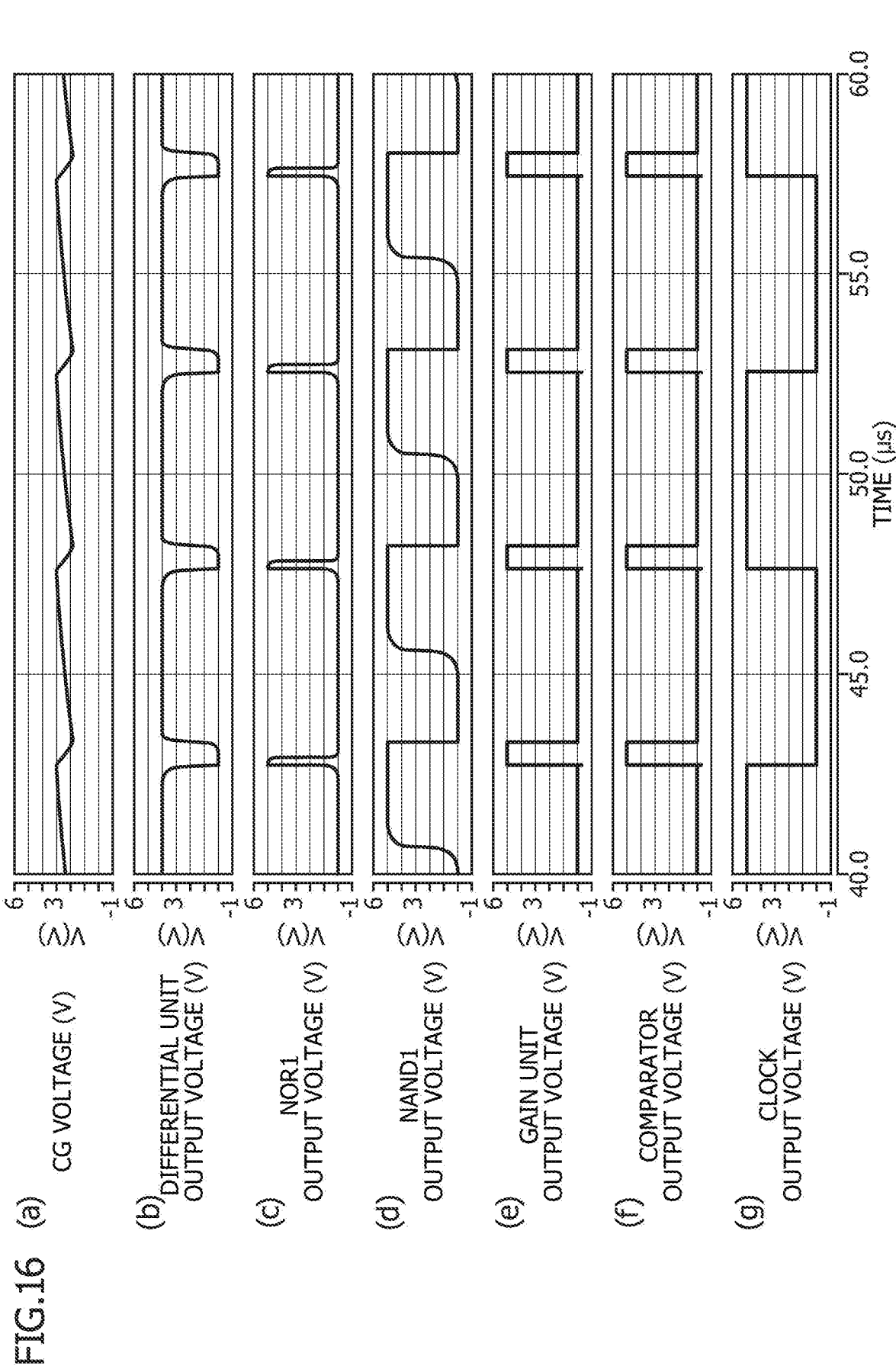
FIG. 16 is a timing chart illustrating the operation of the oscillator circuit (including externally connected CR) according to the third embodiment of the present invention.
Figure 17:
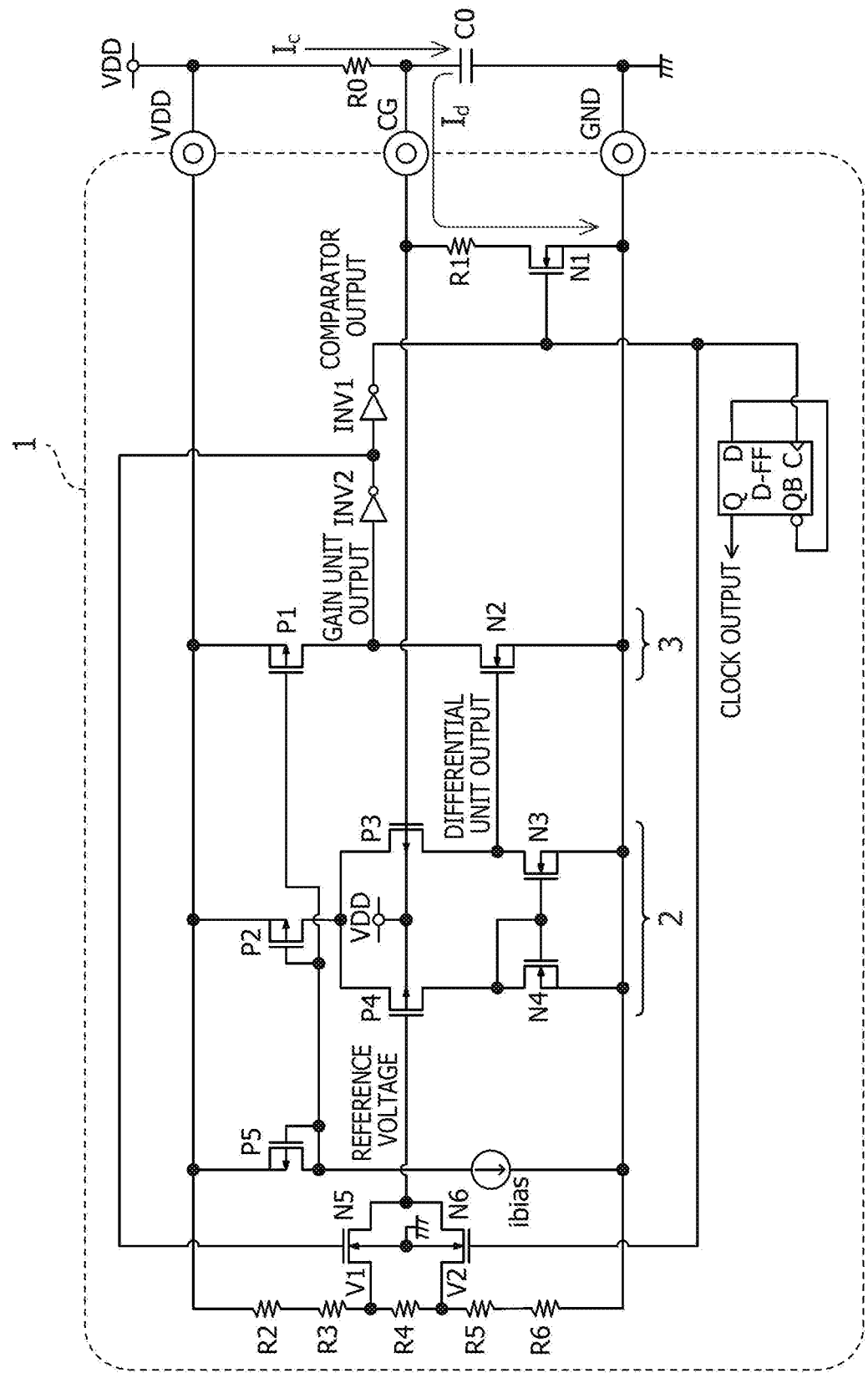
FIG. 17 describes a conventional oscillator circuit (including externally connected CR).

FIG. 15 illustrates the oscillator circuit 1c during typical operation. The oscillator circuit also includes a resistor R0 externally connected between the input terminal CG and the power-supply terminal VDD as well as a capacitor C0 externally connected between the input terminal CG and the ground terminal GND. FIG. 16 illustrates simulated waveforms of the voltage at various parts of the oscillator circuit 1c during typical operation. In a manner similar to that in FIG. 18, the drawing illustrates that the comparator output voltage has about 200 kHz and the D-type flip-flop circuit D-FF yields the clock output at about 100 kHz.

The second detection logic unit 6 and the second auxiliary circuit 7 may be collectively called an output control unit to control the output of the gain unit.

The configuration of the second detection logic unit 6 may be changed as needed. In one example, the inverter INV5, the negative AND circuit NAND1 and the inverter INV6 may be combined as one logic circuit. In this configuration, the input of the inverter INV5 can be the input of this logic circuit, and the output of the inverter INV6 can be the output of this logic circuit.

These are descriptions of specific embodiments of the present invention, and the present invention is not limited to these embodiments. The concept of the present invention includes various modifications based on the technical idea of the present invention.

In one example, the reference potential of the oscillator circuit is not limited to the ground, which may be set at any potential. To distinguish a plurality of inverters, each of these inverters may be called a n-th inverter. Note here that "n" is a natural number. Similarly, to distinguish a plurality of transistors, each of these transistors may be called an n-th transistor.

As stated above, a control signal to control the oscillator circuit may be a signal generated based on the output of the gain unit or a signal externally input to the oscillator circuit. Such a control signal is input to one of the inputs of the differential unit.

REFERENCE SYMBOL LIST

1 Oscillator circuit
VDD Power-supply terminal
CG Input terminal
GND Ground terminal
2 Differential unit
P2 to P5 Transistor
N3, N4 Transistor
N5, N6 Switch
R2 to R6 Resistor
V1, V2 Reference voltage
3 Gain unit
P1 Transistor
N2 Transistor
INV2 Inverter
INV1 Inverter
R1 Resistor
N1 Transistor
D-FF D-type flip-flop circuit
1a Oscillator circuit
4 Charge-discharge control unit
INV3 Inverter
NOR1 Negative OR circuit
N7 Transistor
INV4 Inverter
P6 Transistor
R0 Resistor
C0 Capacitor
9 Rectangular-wave generation circuit
1b Oscillator circuit
41 First detection logic unit
42 First auxiliary circuit
5 Second auxiliary circuit
N8 Switch
N9 to N11 Transistor
1c Oscillator circuit
6 Second detection logic unit
INV5, INV6 Inverter
NAND1 Negative AND circuit
7 Second auxiliary circuit
N8a Transistor

The invention claimed is:

1. An oscillator circuit using a comparator having a differential unit and a gain unit, comprising:
a charge-discharge control unit configured to connect to an output of the differential unit, the charge-discharge control unit being configured to control charge-discharge of Miller capacitance between the gate and the drain of a MOSFET serving as an amplifier of the gain unit and gate capacitance of the MOSFET; and
an output control unit configured to control an output of the gain unit.

2. The oscillator circuit according to claim 1, wherein the output of the differential unit is configured to be connected to the gate of the MOSFET, and
the output control unit has a first transistor having a drain being configured to be connected to the output of the gain unit, a source being configured to be connected to a reference potential of the oscillator circuit, and a gate being configured to be connected to the output of the differential unit.

3. The oscillator circuit according to claim 2, wherein the charge-discharge control unit includes:
a logic circuit configured to receive a control signal to control the oscillator circuit; and
an inverter configured to receive an output of the logic circuit, and
wherein the output control unit further includes:
a second transistor having a drain configured to be connected to the output of the gain unit, a source configured to be connected to the drain of the first transistor, and a gate configured to be connected to the output of the inverter; and
a switch configured to be inserted between the output of the differential unit and the gate of the first transistor, and having a gate being configured to be connected to the output of the inverter.

4. The oscillator circuit according to claim 3, wherein the output control unit further includes a third transistor having a drain configured to be connected to the gate of the first transistor, a source configured to be connected to the reference potential of the oscillator circuit, and a gate configured to be connected to the output of the logic circuit.

5. The oscillator circuit according to claim 3, wherein the charge-discharge control unit further includes a fourth transistor having a drain configured to be connected to the gate of the MOSFET, a source configured to be connected to the reference potential of the oscillator circuit, and a gate configured to be connected to the output of the logic circuit.

6. The oscillator circuit according to claim 1, wherein the charge-discharge control unit includes a first inverter configured to receive a control signal to control the oscillator circuit, and wherein the output control unit includes:
a logic circuit configured to receive the output of the first inverter and the output of the gain unit; and
a first transistor having a drain configured to be connected to the output of the gain unit, a source configured to be connected to a reference potential of the oscillator circuit, and a gate configured to be connected to the output of the logic circuit.

7. The oscillator circuit according to claim 6, wherein the logic circuit includes:
a second inverter configured to receive the output of the gain unit;
a negative AND circuit configured to receive the output of the second inverter and the output of the first inverter; and
a third inverter configured to receive the output of the negative AND circuit, and
wherein the output of the third inverter is the output of the logic circuit.

8. The oscillator circuit according to claim 7, wherein the second inverter has a logical threshold voltage that is higher than a logical threshold voltage of the first inverter.

9. The oscillator circuit according to claim 6, wherein the charge-discharge control unit further includes a second transistor having a drain configured to be connected to the gate of the MOSFET, a source configured to be connected to the reference potential of the oscillator circuit, and a gate configured to be connected to the output of a negative OR circuit, the negative OR circuit being configured to receive the output of the first inverter and the output of the differential unit.

10. The oscillator circuit according to claim 3, wherein the control signal is a signal generated based on the output of the gain unit or a signal externally input to the oscillator circuit, and
wherein the control signal is input to one of the inputs of the differential unit.

11. The oscillator circuit according to claim 6, wherein the control signal is a signal generated based on the output of the gain unit or a signal externally input to the oscillator circuit, and
wherein the control signal is input to one of the inputs of the differential unit.

* * * * *